(12) United States Patent
Dai et al.

(10) Patent No.: US 10,985,873 B2
(45) Date of Patent: Apr. 20, 2021

(54) CRC BITS FOR INFORMATION TRANSMISSION METHOD AND DEVICE

(71) Applicant: HUAWEI TECHNOLOGIES CO., LTD., Guangdong (CN)

(72) Inventors: Shengchen Dai, Hangzhou (CN); Gongzheng Zhang, Hangzhou (CN); Chen Xu, Hangzhou (CN); Hejia Luo, Hangzhou (CN); Yinggang Du, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/518,573

(22) Filed: Jul. 22, 2019

(65) Prior Publication Data

US 2019/0349131 A1 Nov. 14, 2019

Related U.S. Application Data

(63) Continuation of application No. PCT/CN2018/072809, filed on Jan. 16, 2018.

(30) Foreign Application Priority Data

Jan. 25, 2017 (CN) .......................... 201710056763.1

(51) Int. Cl.
*H04W 4/00* (2018.01)
*H04L 1/00* (2006.01)
(Continued)

(52) U.S. Cl.
CPC .......... *H04L 1/0061* (2013.01); *H03M 13/09* (2013.01); *H03M 13/27* (2013.01); *H04L 1/0064* (2013.01); *H04L 1/0067* (2013.01); *H04L 1/0071* (2013.01)

(58) Field of Classification Search
CPC ... H04L 1/0061; H04L 1/0064; H04L 1/0071; H04L 1/0067
See application file for complete search history.

(56) References Cited

U.S. PATENT DOCUMENTS 10,327,235 B2 * 6/2019 Shelby ................ H04L 27/0006
2011/0228883 A1 9/2011 Liu et al.
(Continued)

FOREIGN PATENT DOCUMENTS

CN 102035623 A 4/2011
CN 102271023 A 12/2011
(Continued)

OTHER PUBLICATIONS

Qualcomm Incorporated, PBCH channel coding. 3GPP TSG-RAN WG1 NR Ad-Hoc, Jan. 16-20, 2017 Spokane, Washington, USA, R1-1700837, 3 pages.
(Continued)

*Primary Examiner* — Abdelnabi O Musa
(74) *Attorney, Agent, or Firm* — Fish & Richardson P.C.

(57) ABSTRACT

Example information transmission methods and devices are disclosed. One example method is applied to a network device and includes determining CRC bits of to-be-sent information bits, concatenating the CRC bits and the to-be-sent information bits to obtain a first information sequence, and interleaving bits in the first information sequence in an interleaving manner or scrambling the bits in the first information sequence in a scrambling manner, to obtain a second information sequence, to ensure that bits at locations of the CRC bits after a cyclic shift cannot check bits at locations of the to-be-sent information bits after the cyclic shift. A cyclic shift is performed on the second information sequence to obtain a third information sequence, where a quantity of cyclically shifted bits is used to carry informa-
(Continued)

tion about some bits of a system frame number, and the third information sequence is sent.

17 Claims, 11 Drawing Sheets

(51) Int. Cl.
*H03M 13/09* (2006.01)
*H03M 13/27* (2006.01)

(56) References Cited

U.S. PATENT DOCUMENTS

| | | | |
|---|---|---|---|
| 2011/0255631 A1 | 10/2011 | Pi | |
| 2012/0198305 A1* | 8/2012 | Abu-Surra | H04L 1/0061 714/758 |
| 2013/0265927 A1 | 10/2013 | Joung et al. | |
| 2013/0322402 A1* | 12/2013 | Chang | H04L 1/0071 370/331 |
| 2014/0078978 A1* | 3/2014 | Cheng | H04L 1/0041 370/329 |
| 2014/0146696 A1 | 5/2014 | Lin et al. | |
| 2015/0359003 A1 | 12/2015 | Kim et al. | |
| 2016/0014727 A1* | 1/2016 | Nimbalker | H04W 72/042 370/329 |
| 2017/0332247 A1 | 11/2017 | Hua et al. | |
| 2018/0199076 A1 | 7/2018 | Moon et al. | |

FOREIGN PATENT DOCUMENTS

| | | |
|---|---|---|
| CN | 102484560 A | 5/2012 |
| CN | 103944699 A | 7/2014 |
| CN | 104770027 A | 7/2015 |
| CN | 105009479 A | 10/2015 |
| CN | 105453456 A | 3/2016 |
| CN | 105453548 A | 3/2016 |
| WO | 2016119244 A1 | 8/2016 |

OTHER PUBLICATIONS

Qualcomm Incorporated, Conveying symbol index during multi-beam Sync. 3GPP TSG RAN WG1 Meeting #87 Reno, Nevada, USA, Nov. 14-18, 2016, R1-1612034, 3 pages.
PCT International Search Report and Written Opinion in International Application No. PCT/CN2018/072,809, dated Mar. 23, 2018, 15 pages (With English Translation).
Extended European Search Report issued in European Application No. 18745295.8 dated Dec. 9, 2019, 10 pages.
R1-160875—Qualcomm Incorporated, "NB-PBCH design," 3GPP Draft; 3GPP TSG RAN WG1 Meeting #84, St Julian's, Malta, Feb. 15-19, 2016, XP051064422, 10 pages.
Office Action issued in Chinese Application No. 201710056763.1 dated May 20, 2020, 16 pages (With English Translation).

* cited by examiner

CRC BITS FOR INFORMATION TRANSMISSION METHOD AND DEVICE

CROSS-REFERENCE TO RELATED APPLICATIONS

This application is a continuation of International Application No. PCT/CN2018/072809, filed on Jan. 16, 2018, which claims priority to Chinese Patent Application No. 201710056763.1, filed on Jan. 25, 2017. The disclosures of the aforementioned applications are hereby incorporated by reference in their entireties.

TECHNICAL FIELD

The present invention relates to the field of communications technologies, and in particular, to an information transmission method and a device.

BACKGROUND

For a physical layer broadcast channel (Physical Broadcast Channel, PBCH) that is a physical layer broadcast channel of long term evolution (Long Term Evolution, LTE). A network device may send information bits to a terminal through the PBCH, for example, downlink system bandwidth, a physical hybrid automatic repeat request indicator channel (PhysicalHybrid ARQ Indicator Channel, PHICH) configuration, a system frame number (System Frame Number, SFN), and reserved bits. In addition, to enable the terminal to check whether the received information bits are correct, the network device further needs to send, to the terminal, cyclic redundancy check (Cyclic Redundancy Check, CRC) used to check the information bits. To ensure that the terminal can receive the information bits and the CRC bits, the network device repeatedly sends the information bits and the CRC bits four times through the PBCH in a 40 ms period, and same encoded bits are carried each time.

However, because the system frame number in the information bits includes only eight most significant bits of the system frame number, two least significant bits need to be carried in another manner. Currently, a manner of carrying the two least significant bits of the system frame number is as follows: Information repeatedly sent four times is scrambled by using different scrambling sequences, and the two least significant bits of the system frame number may be carried by using the scrambling sequences. However, in the foregoing manner, because the information bits and the CRC bits sent each time are scrambled by using different scrambling sequences, each time the terminal receives the information bits and the CRC bits, the terminal needs to separately try four types of scrambling sequences to determine a scrambling sequence used for the received information bits and CRC bits. As a result, each time the terminal receives the information bits and the CRC bits, the terminal needs to make a plurality of attempts on scrambling sequences to decode the information bits and the CRC bits. Consequently, a delay of obtaining the information bits by the terminal is increased.

SUMMARY

Embodiments of the present invention disclose an information transmission method and a device, to reduce a delay of obtaining information by a terminal.

According to a first aspect, an information transmission method is disclosed. The method is applied to a network device and includes: determining CRC bits of to-be-sent information bits; concatenating the CRC bits and the to-be-sent information bits to obtain a first information sequence; interleaving bits in the first information sequence in an interleaving manner or scrambling the bits in the first information sequence in a scrambling manner, to obtain a second information sequence; performing a cyclic shift on the second information sequence to obtain a third information sequence; and sending the third information sequence. A quantity of cyclically shifted bits carries information about some bits of a system frame number, so that the terminal can determine, through a reverse cyclic shift, a shift performed on information by the network device before the network device sends the information, to determine the system frame number. Therefore, it can be learned that decoding does not need to be performed a plurality of times. In this way, a quantity of decoding times may be decreased, thereby reducing a delay of obtaining the information by the terminal. In addition, the interleaving manner or the scrambling manner can ensure that bits at locations of the CRC bits after the cyclic shift cannot check bits at locations of the to-be-sent information bits after the cyclic shift. Therefore, CRC check can succeed only when the quantity of cyclically shifted bits is correctly determined so that the to-be-sent information bits are reversely cyclically shifted to locations before the cyclic shift. In this way, the information that is about some bits of the system frame number and that is carried by the quantity of cyclically shifted bits can be accurately determined, so that the terminal can accurately obtain the information sent by the network device.

In an embodiment, a bit at a preset bit location of the reserved bits may be set to 1 to obtain target information bits. CRC bits of the target information bits are determined, and the CRC bits and the target information are concatenated to obtain the first information sequence. When all bits included in the reserved bits are 0, the bit at the preset bit location of the reserved bits may be set to 1 to avoid that all the to-be-sent information bits are 0, and it can be ensured, in an interleaving manner, that bits at locations of the CRC bits after the cyclic shift cannot check bits at locations of the to-be-sent information bits after the cyclic shift, so that the terminal can accurately obtain the information sent by the network device.

In an embodiment, the to-be-sent information bits may include reserved bits. A bit at a first bit location may be exchanged with a bit at a second bit location to obtain a fourth information sequence, and the fourth information sequence is determined as the second information sequence. The first bit location is a first location in the first information sequence, the second bit location is any bit location of the reserved bits, and a bit that is at the first bit location and that is obtained after interleaving is 1. An objective of an interleaving manner may be achieved by an exchanging manner, so that it can be ensured that bits at locations of the CRC bits after a cyclic shift cannot check bits at locations of the to-be-sent information bits after the cyclic shift. Therefore, CRC check can succeed only when the quantity of cyclically shifted bits is correctly determined so that the to-be-sent information bits are reversely cyclically shifted to locations before the cyclic shift. In this way, the information that is about some bits of the system frame number and that is carried by the quantity of cyclically shifted bits can be accurately determined, so that the terminal can accurately obtain the information sent by the network device. When all bits included in the reserved bits are 0, the bit at the second bit location needs to be set to 1 before interleaving is performed. When all the bits included in the reserved bits are 1, the foregoing processing does not need to be performed before interleaving is performed.

In an embodiment, bits at t bit locations other than the second bit location of the reserved bits may be exchanged with bits at t bit locations in the fourth information sequence other than bit locations included in the reserved bits, to obtain a fifth information sequence, and the fifth information sequence is determined as the second information sequence, where t is greater than or equal to 1 and less than a quantity of bit locations of the reserved bits, and the bits at the t bit locations of the reserved bits each are 1. An objective of an interleaving manner may be further achieved by an exchanging manner, so that it can be ensured that bits at locations of the CRC bits after a cyclic shift cannot check bits at locations of the to-be-sent information bits after the cyclic shift. Therefore, CRC check can succeed only when the quantity of cyclically shifted bits is correctly determined so that the to-be-sent information bits are reversely cyclically shifted to locations before the cyclic shift. In this way, the information that is about some bits of the system frame number and that is carried by the quantity of cyclically shifted bits can be accurately determined, so that the terminal can accurately obtain the information sent by the network device.

In an embodiment, the to-be-sent information bits may include reserved bits. A bit at a first bit location may be shifted to the beginning of the first information sequence to obtain a fourth information sequence, and the fourth information sequence is determined as the second information sequence. The first bit location is any bit location of the reserved bits, and the bit at the first bit location is 1. An objective of an interleaving manner is achieved by a shifting manner, so that it can be ensured that bits at locations of the CRC bits after a cyclic shift cannot check bits at locations of the to-be-sent information bits after the cyclic shift. Therefore, CRC check can succeed only when the quantity of cyclically shifted bits is correctly determined so that the to-be-sent information bits are reversely cyclically shifted to locations before the cyclic shift. In this way, the information that is about some bits of the system frame number and that is carried by the quantity of cyclically shifted bits can be accurately determined, so that the terminal can accurately obtain the information sent by the network device.

In an embodiment, a bit at a second bit location may be shifted to a target location to obtain a fifth information sequence, and the fifth information sequence is determined as the second information sequence. The second bit location is any one of t bit locations other than the first bit location of the reserved bits, the target location is any one of t intervals other than a target interval in the fourth information sequence, the target interval is an interval between bit locations other than the first bit location of the reserved bits, t is greater than or equal to 1 and less than a quantity of bit locations of the reserved bits, and the bit at the second bit location is 1. An objective of an interleaving manner is further achieved by a shifting manner, so that it can be ensured that bits at locations of the CRC bits after a cyclic shift cannot check bits at locations of the to-be-sent information bits after the cyclic shift. Therefore, CRC check can succeed only when the quantity of cyclically shifted bits is correctly determined so that the to-be-sent information bits are reversely cyclically shifted to locations before the cyclic shift. In this way, the information that is about some bits of the system frame number and that is carried by the quantity of cyclically shifted bits can be accurately determined, so that the terminal can accurately obtain the information sent by the network device.

In an embodiment, the to-be-sent information bits may include reserved bits. A bit at a third bit location may be shifted to the beginning of the first information sequence to obtain a fourth information sequence, and the fourth information sequence is determined as the second information sequence. The third bit location is a last bit location in the first information sequence, and a bit at a first location in the fourth information sequence is 1. An objective of an interleaving manner is achieved by a shifting manner, so that it can be ensured that bits at locations of the CRC bits after a cyclic shift cannot check bits at locations of the to-be-sent information bits after the cyclic shift. Therefore, CRC check can succeed only when the quantity of cyclically shifted bits is correctly determined so that the to-be-sent information bits are reversely cyclically shifted to locations before the cyclic shift. In this way, the information that is about some bits of the system frame number and that is carried by the quantity of cyclically shifted bits can be accurately determined, so that the terminal can accurately obtain the information sent by the network device.

In an embodiment, encoding and rate matching may be first sequentially performed on the third information sequence to obtain a sixth information sequence, and then the sixth information sequence is sent. This can improve reliability of information transmission.

In an embodiment, the second information sequence may be first encoded to obtain a sixth information sequence, and then a cyclic shift is performed on the sixth information sequence to obtain the third information sequence. This can improve reliability of information transmission.

According to a second aspect, a network device is disclosed, and the network device includes modules configured to perform the information transmission method provided in any one of the first aspect or the possible implementations of the first aspect.

According to a third aspect, a network device is disclosed, and the network device includes a processor, a memory, and a transceiver. The memory is configured to store program code, the processor is configured to execute the program code, and the transceiver is configured to communicate with a terminal. When the processor executes the program code stored in the memory, the processor performs the information transmission method disclosed in any one of the first aspect or the possible implementations of the first aspect.

According to a fourth aspect, a readable storage medium is disclosed, and the readable storage medium stores program code that is used by a network device to perform the information transmission method disclosed in any one of the first aspect or the possible implementations of the first aspect.

According to a fifth aspect, an information transmission method is disclosed. The method is applied to a network device and includes: determining cyclic redundancy check CRC bits of to-be-sent information bits; concatenating the CRC bits and the to-be-sent information bits to obtain a first information sequence; performing a cyclic shift on the first information sequence to obtain a second information sequence; and sending the second information sequence. A quantity of cyclically shifted bits carries information about some bits of a system frame number, so that the terminal can determine, through a reverse cyclic shift, a shift performed on information by the network device before the network device sends the information, to determine the system frame number. Therefore, it can be learned that decoding does not need to be performed a plurality of times. In this way, a quantity of decoding times may be decreased, thereby reducing a delay of obtaining the information by the terminal. In addition, the to-be-sent information bits include reserved bits, at least one of the reserved bits is at the beginning of the to-be-sent information bits, and a bit at a first location of the to-be-sent information bits that is a reserved bit location is 1. Therefore, it can be ensured that bits at locations of the CRC bits after the cyclic shift cannot check bits at locations of the to-be-sent information bits after the cyclic shift, so that the terminal can accurately obtain the information sent by the network device.

In an embodiment, t bit locations of the reserved bits are bit locations other than the first location of the to-be-sent information bits and bit locations at which the reserved bits are located, and all bits at the t bit locations are 1. Therefore, it can be further ensured that bits at locations of the CRC bits after the cyclic shift cannot check bits at locations of the to-be-sent information bits, so that the terminal can accurately obtain the information sent by the network device, where t is greater than or equal to 1 and less than a quantity of bit locations of the reserved bits.

In an embodiment, encoding and rate matching may be first sequentially performed on the second information sequence to obtain a third information sequence, and then the third information sequence is sent. This can improve reliability of information transmission.

In an embodiment, the first information sequence may be first encoded to obtain a fourth information sequence, and then a cyclic shift is performed on the fourth information sequence to obtain the second information sequence. This can improve reliability of information transmission.

According to a sixth aspect, a network device is disclosed, and the network device includes modules configured to perform the information transmission method provided in any one of the fifth aspect or the possible implementations of the fifth aspect.

According to a seventh aspect, a network device is disclosed, and the network device includes a processor, a memory, and a transceiver. The memory is configured to store program code, the processor is configured to execute the program code, and the transceiver is configured to communicate with a terminal. When the processor executes the program code stored in the memory, the processor performs the information transmission method disclosed in any one of the fifth aspect or the possible implementations of the fifth aspect.

According to an eighth aspect, a readable storage medium is disclosed, and the readable storage medium stores program code that is used by a network device to perform the information transmission method disclosed in any one of the fifth aspect or the possible implementations of the fifth aspect.

According to a ninth aspect, an information transmission method is disclosed. The method is applied to a terminal and includes: receiving a first information sequence sent by a network device; performing a reverse cyclic shift on the first information sequence to obtain a second information sequence; de-interleaving the second information sequence based on an interleaving manner or descrambling the second information sequence based on a scrambling manner, to obtain a third information sequence; and when CRC check of the third information sequence succeeds, determining bits in the third information sequence that are at information bit locations as information bits, and determining some bits of a system frame number based on a mapping relationship by using a quantity of reversely cyclically shifted bits. The terminal may determine, through a reverse cyclic shift, a shift performed on information by the network device before the network device sends the information, to determine the system frame number. Therefore, it can be learned that decoding does not need to be performed a plurality of times. In this way, a quantity of decoding times may be decreased, thereby reducing a delay of obtaining the information by the terminal. In addition, the interleaving manner or the scrambling manner can ensure that bits at CRC bit locations after a cyclic shift cannot check bits at the information bit locations after the cyclic shift. Therefore, the CRC check can succeed only when the quantity of reversely cyclically shifted bits is correctly determined. In this way, information that is about some bits of the system frame number and that is carried by a quantity of cyclically shifted bits can be accurately determined, so that the terminal can accurately obtain the information sent by the network device.

In an embodiment, the information bits include reserved bits, and a bit at a preset bit location of the reserved bits is 1. Therefore, the CRC check can succeed only when the quantity of reversely cyclically shifted bits is correctly determined, so that the terminal can accurately obtain the information sent by the network device.

In an embodiment, the second information sequence may include reserved bits. A bit at a first bit location may be exchanged with a bit at a second bit location to obtain a fourth information sequence, and the fourth information sequence is determined as the third information sequence. The first bit location is a first location in the second information sequence, and the second bit location is a preset location in locations of the reserved bits.

In an embodiment, bits at t preset bit locations other than the second bit location in the locations of the reserved bits may be exchanged with bits at t preset bit locations in bit locations, in the fourth information sequence, other than the locations of the reserved bits and the first bit location, to obtain a fifth information sequence, and the fifth information sequence is determined as the third information sequence, where t is greater than or equal to 1 and less than a quantity of bit locations of the reserved bits.

In an embodiment, the second information sequence may include reserved bits, and a bit at a first location in the second information sequence may be shifted to a first interval to obtain a fourth information sequence, and the fourth information sequence is determined as the third information sequence. The first interval is a preset interval between bit locations in locations of the reserved bits.

In an embodiment, bits at t preset bit locations may be separately shifted to t preset intervals to obtain a fifth information sequence, and the fifth information sequence is determined as the third information sequence, where t is greater than or equal to 1 and less than a quantity of bit locations of the reserved bits.

In an embodiment, the second information sequence may include reserved bits, and a bit at a first bit location in the second information sequence may be shifted to the end of the second information sequence to obtain fourth information, and the fourth information sequence is determined as the third information sequence.

In an embodiment, the first information sequence may be first decoded to obtain a sixth information sequence, and then a reverse cyclic shift is performed on the sixth information sequence to obtain the second information sequence. This can decrease a quantity of decoding times.

In an embodiment, the second information sequence may be first decoded to obtain a sixth information sequence, and then the sixth information sequence is de-interleaved based on an interleaving manner or the second information sequence is descrambled based on a scrambling manner, to obtain the third information sequence.

According to a tenth aspect, a terminal is disclosed, and the terminal includes modules configured to perform the information transmission method provided in any one of the ninth aspect or the possible implementations of the ninth aspect.

According to an eleventh aspect, a terminal is disclosed, and the terminal includes a processor, a memory, and a transceiver. The memory is configured to store program code, the processor is configured to execute the program code, and the transceiver is configured to communicate with a network device. When the processor executes the program code stored in the memory, the processor performs the information transmission method disclosed in any one of the ninth aspect or the possible implementations of the ninth aspect.

According to a twelfth aspect, a readable storage medium is disclosed, and the readable storage medium stores program code that is used by a terminal to perform the information transmission method disclosed in any one of the ninth aspect or the possible implementations of the ninth aspect.

According to a thirteenth aspect, an information transmission method is disclosed. The method is applied to a terminal and includes: receiving a first information sequence sent by a network device; performing a reverse cyclic shift on the first information sequence to obtain a second information sequence; and when CRC check of the second information sequence succeeds, determining bits in the second information sequence that are at information bit locations as information bits, and determining some bits of a system frame number based on a mapping relationship by using a quantity of reversely cyclically shifted bits, where the information bits include reserved bits, at least one bit of the reserved bits is at the beginning of the information bits, and a bit at a first location of the information bits that is a reserved bit location is 1. The terminal may determine, through a reverse shift, a shift performed on information by the network device before the network device sends the information, to determine the system frame number. Therefore, it can be learned that decoding does not need to be performed a plurality of times. In this way, a quantity of decoding times may be decreased, thereby reducing a delay of obtaining the information by the terminal. In addition, because the bit at the first location of the information bits that is the reserved bit location is 1, the CRC check can succeed only when the quantity of reversely cyclically shifted bits is correctly determined, so that the terminal can accurately obtain the information sent by the network device.

In an embodiment, t bit locations of the reserved bits are bit locations other than the first location of the information bits and bit locations at which the reserved bits are located, and all bits at the t bit locations are 1. Therefore, the CRC check can succeed only when the quantity of reversely cyclically shifted bits is correctly determined, so that the terminal can accurately obtain the information sent by the network device, where t is greater than or equal to 1 and less than a quantity of bit locations of the reserved bits.

In an embodiment, the first information sequence may be first decoded to obtain a third information sequence, and then a reverse cyclic shift is performed on the third information sequence to obtain the second information sequence. This can decrease a quantity of decoding times.

In an embodiment, the second information sequence may be first decoded to obtain a third information sequence, and when CRC check of the third information sequence succeeds, bits in the third information sequence that are at the information bit locations are determined as the information bits.

According to a fourteenth aspect, a terminal is disclosed, and the terminal includes modules configured to perform the information transmission method provided in any one of thirteenth aspect or the possible implementations of the thirteenth aspect.

According to a fifteenth aspect, a terminal is disclosed, and the terminal includes a processor, a memory, and a transceiver. The memory is configured to store program code, the processor is configured to execute the program code, and the transceiver is configured to communicate with a network device. When the processor executes the program code stored in the memory, the processor performs the information transmission method according to any one of the thirteenth aspect or the possible implementations of the thirteenth aspect.

According to a sixteenth aspect, a readable storage medium is disclosed, and the readable storage medium stores program code that is used by a terminal to perform the information transmission method disclosed in any one of the thirteenth aspect or the possible implementations of the thirteenth aspect.

DESCRIPTION OF EMBODIMENTS

The embodiments of the present invention disclose an information transmission method and a device, to reduce a delay of obtaining information by a terminal. Detailed descriptions are separately provided below.

To better understand the information transmission method and the device disclosed in the embodiments of the present invention, an application scenario used in the embodiments of the present invention is first described below. A network device sends an information sequence four times through a PBCH in a 40 ms period. The information sequence sent each time carries same encoded bits, but quantities of cyclically shifted bits are different. A terminal may try different quantities of cyclically shifted bits by using CRC bits in the information sequence. If CRC check succeeds, the terminal may determine a quantity of cyclically shifted bits, that is, may determine a system frame number in sent information bits, namely, two least significant bits of the SFN. In this solution, a feature of a cyclic shift of tail biting convolutional codes (Tail Biting Convolutional Codes, TBCC) is used, so that a quantity of decoding times during blind detection may be decreased, thereby reducing a delay. However, for a combination of some specific information bit sequences, after a cyclic shift, CRC check performed based on information bit locations and CRC bit locations that are before the cyclic shift also succeeds, that is, a system frame number in a transmitted information sequence cannot be accurately determined. As a result, a system cannot work at some moments, and there is a disadvantage in a system design. For example, it is assumed that information bits are $[a_1, a_2, a_3, \ldots, a_N]$ (including 10 bits of reserved bits), where N is a length of the information bits; and a CRC polynomial sequence is $[b_1, b_2, b_3, \ldots, b_M]$, where M is a length of CRC bits. In this case, obtained CRC bits may be $[c_1, c_2, c_3, \ldots, c_M]$, and the information bits and the CRC bits may be concatenated into $[a_1, a_2, a_3, \ldots, a_N, c_1, c_2, c_3, \ldots, c_M]$. According to a CRC check principle, when the sequence $[a_1, a_2, a_3, \ldots, a_N, c_1, c_2, c_3, \ldots, c_M]$ can be exactly divided by $[b_1, b_2, b_3, \ldots, b_M]$, CRC check succeeds. If information bits $[a_1, a_2, \ldots, a_k]=[0, 0, \ldots, 0]$, it can be learned that a sequence $[a_{k+1}, a_{k+2}, \ldots, a_N, c_1, c_2, c_3, \ldots, c_M]$ can be exactly divided by $[b_1, b_2, b_3, \ldots, b_M]$. The CRC bits plus an information sequence that is obtained after a cyclic shift of L bits is performed is $[a_{L+1}, a_{L+2}, \ldots, a_N, c_1, c_2, c_3, \ldots, c_M, a_1, a_2, \ldots, a_L]$. If L≤k, the sequence can also be exactly divided by $[b_1, b_2, b_3, \ldots, b_M]$ definitely, that is, CRC succeeds during blind detection. In this case, the system frame number cannot be accurately determined.

Figure 1:
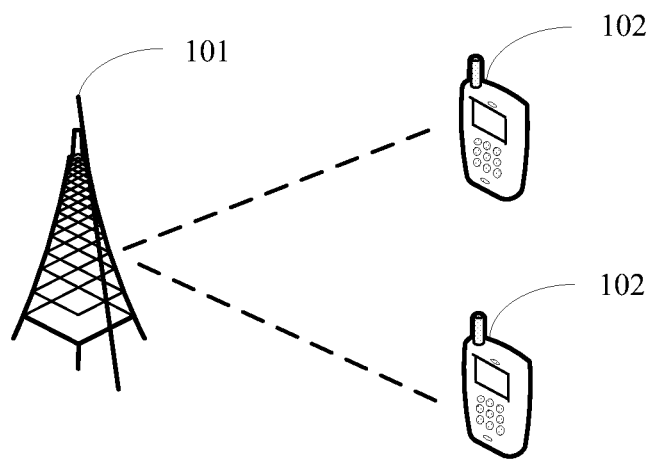
FIG. 1 is a schematic diagram of a network architecture according to an embodiment of the present invention.

To better understand the information transmission method and the device disclosed in the embodiments of the present invention, a network architecture used in the embodiments of the present invention is first described below. FIG. 1 is a schematic diagram of a network architecture according to an embodiment of the present invention. As shown in FIG. 1, the network architecture may include a network device 101 and at least one terminal 102. The network device 101 is configured to send information bits to the terminal 102. The information bits include at least reserved bits and information about some bits of a system frame number. To enable the terminal 102 to determine whether the received information bits are correct, the network device 101 further needs to determine CRC bits of the information bits, and concatenate the information bits and the CRC bits into an information sequence and sends the information sequence to the terminal 102. In addition, because the information bits include only the information about some bits of the system frame number, a cyclic shift may be performed on the information sequence, so as to carry information about remaining bits of the system frame number by using a quantity of cyclically shifted bits. The terminal 102 is configured to: receive the information sequence sent by the network device 101; determine, through a reverse cyclic shift and CRC check, information bits included in the information sequence; and determine, by using a quantity of reversely cyclically shifted bits, the information that is about some bits of the system frame number and that is added by the network device to the quantity of cyclically shifted bits. In addition, to ensure that the terminal can uniquely determine the system frame number by using the quantity of cyclically shifted bits, it can be ensured, in an interleaving manner, a scrambling manner, or the like, that bits at CRC bit locations after a cyclic shift cannot check bits at information bit locations after the cyclic shift.

The network device 101 may be a device used to communicate with the terminal 102. For example, the network device 101 may be a base transceiver station (Base Transceiver Station, BTS) in a Global System for Mobile Communications (Global System for Mobile communication, GSM) or Code Division Multiple Access (Code Division Multiple Access, CDMA), may be a NodeB (NodeB, NB) in a Wideband Code Division Multiple Access (Wideband Code Division Multiple Access, WCDMA) system, may be an evolved NodeB (Evolutional Node B, eNB or eNodeB) in a long term evolution (Long Term Evolution, LTE) system, or may be a terminal that functions as a network device during device-to-device (Device to Device, D2D) communication. Alternatively, the network device 101 may be a relay station, an access point, an in-vehicle device, a transmission point, a wearable device, a network side device in a future 5G network, a network device in a future evolved public land mobile network (Public Land Mobile Network, PLMN), any device having a network function, or the like.

The terminal 102 may be user equipment (User Equipment, UE), an access terminal, a subscriber unit, a subscriber station, a mobile station, a mobile console, a remote station, a remote terminal, a mobile device, a user terminal, a wireless communications device, a user agent, or a user apparatus. The access terminal may be a cellular phone, a cordless phone, a Session Initiation Protocol (Session Initiation Protocol, SIP) phone, a wireless local loop (Wireless Local Loop, WLL) station, a personal digital assistant (Personal Digital Assistant, PDA), a handheld device having a wireless communication function, a computing device, another processing device connected to a wireless modem, an in-vehicle device, a wearable device, a terminal in a future 5G network, a terminal in a future evolved PLMN network, or the like.

Figure 2:
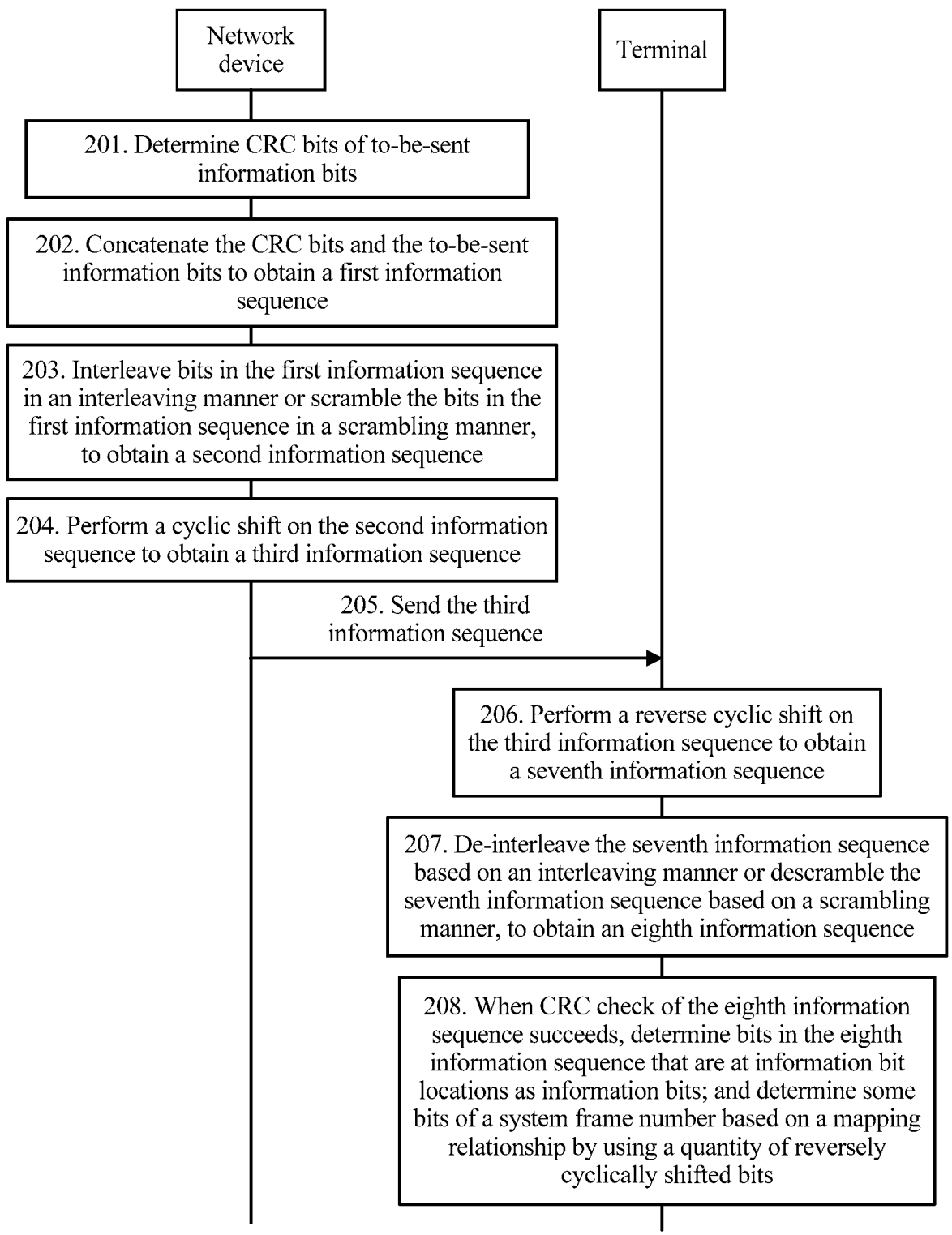
FIG. 2 is a schematic flowchart of an information transmission method according to an embodiment of the present invention.

Based on the network architecture shown in FIG. 1, FIG. 2 is a schematic flowchart of an information transmission method according to an embodiment of the present invention. The information transmission method is described from perspectives of the network device 101 and the terminal 102. As shown in FIG. 2, the data transmission method may include the following steps.

201. A network device determines CRC bits of to-be-sent information bits.

In this embodiment, when the network device has to-be-sent information bits, that is, when the network device needs to send information bits to a terminal, the network device determines CRC bits of the to-be-sent information bits. The CRC bits are obtained through calculation by using the to-be-sent information bits. The terminal may determine, by using the CRC bits, whether the received information bits are correct information bits, so that the terminal can accurately determine transmitted information by using the CRC bits. The to-be-sent information bits include reserved bits, and the reserved bits may be an all zeros sequence, an all ones sequence, or another sequence.

202. The network device concatenates the CRC bits and the to-be-sent information bits to obtain a first information sequence.

In this embodiment, after determining the CRC bits of the to-be-sent information bits, the network device may concatenate the CRC bits and the to-be-sent information bits to obtain the first information sequence. The network device may concatenate the CRC bits after the to-be-sent information bits, or may concatenate the to-be-sent information bits after the CRC bits, may insert the CRC bits into a location between the to-be-sent information bits, or may use another concatenation manner. This is not limited in this embodiment. Bit locations of the reserved bits may be contiguous or intermittent. For example, a tenth bit location to a fifteenth bit location in the first information sequence may be locations of the reserved bits; or a fifth bit location, an eighth bit location, a tenth bit location, a thirteenth bit location, a fifteenth bit location, and a seventeenth bit location in the first information sequence may be locations of the reserved bits.

In this embodiment, when the reserved bits are an all zeros sequence, a bit at a preset bit location of the reserved bits may be set to 1 to obtain target information bits. The CRC bits of the to-be-sent information bits are determined, that is, CRC bits of the target information bits are determined. The CRC bits and the to-be-sent information are concatenated to obtain the first information sequence, that is, the CRC bits and the target information are concatenated to obtain the first information sequence. This can avoid that all the information bits are 0.

203. The network device interleaves bits in the first information sequence in an interleaving manner or scrambles the bits in the first information sequence in a scrambling manner, to obtain a second information sequence.

In this embodiment, after concatenating the CRC bits and the to-be-sent information bits to obtain the first information sequence, the network device may interleave the bits in the first information sequence in an interleaving manner or scramble the bits in the first information sequence in a scrambling manner, to obtain the second information sequence, so as to ensure, through interleaving or scrambling, that bits at locations of the CRC bits after a cyclic shift cannot check bits at locations of the to-be-sent information bits after the cyclic shift. The interleaving manner or the scrambling manner may be predetermined, for example, determined based on a quantity of cyclically shifted bits.

In this embodiment, a bit at a first bit location may be exchanged with a bit at a second bit location to obtain a fourth information sequence, and the fourth information sequence is determined as the second information sequence. The first bit location is a first location in the first information sequence, the second bit location is any bit location of the reserved bits, and a bit that is at the first bit location and that is obtained after interleaving is 1. When the bit at the second bit location is 0 before interleaving, the bit at the second bit location may be first set to 1, and then interleaving is performed. Alternatively, interleaving may be first performed, and then the bit that is at the first bit location and that is obtained after interleaving is set to 1.

In this embodiment, after the bit at the first bit location is exchanged with the bit at the second bit location to obtain the fourth information sequence, bits at t bit locations other than the second bit location of the reserved bits may be exchanged with bits at t bit locations in the fourth information sequence other than bit locations included in the reserved bits, to obtain a fifth information sequence, and the fifth information sequence is determined as the second information sequence, where t is greater than or equal to 1 and less than a quantity of bit locations of the reserved bits, and the bits at the t bit locations of the reserved bits each are 1.

In this embodiment, a bit at a first bit location may be shifted to the beginning of the first information sequence to obtain a fourth information sequence, and the fourth information sequence is determined as the second information sequence. The bit at the first bit location is 1.

In this embodiment, after the bit at the first bit location is shifted to the beginning of the first information sequence to obtain the fourth information sequence, a bit at a second bit location may be shifted to a target location to obtain a fifth information sequence, and the fifth information sequence is determined as the second information sequence. The target location is any one of t intervals other than a target interval in the fourth information sequence, the target interval is an interval between bit locations other than the first bit location of the reserved bits, the second bit location is any one oft bit locations other than the first bit location of the reserved bits, t is greater than or equal to 1 and less than a quantity of bit locations of the reserved bits, and the bit at the second bit location is 1.

In this embodiment, a bit at a third bit location may be shifted to the beginning of the first information sequence to obtain a fourth information sequence, and the fourth information sequence is determined as the second information sequence. The third bit location is a last bit location in the first information sequence, and a bit at a first location in the fourth information sequence is 1.

In this embodiment, scrambling the bits in the first information sequence in a scrambling manner may be adding the first information sequence to a preset sequence. A length of the preset sequence is the same as a length of the first information sequence. When the preset sequence is 40 bits, and a quantity of some bits of a system frame number that needs to be carried is two, information about the two bits of the system frame number may be carried by using a quantity of cyclically shifted bits such as 0, 10, 20, or 30. In this case, the preset sequence may be 0100011001110100111101000010101101010000, but the preset sequence is not unique.

204. The network device performs the cyclic shift on the second information sequence to obtain a third information sequence.

In this embodiment, the to-be-sent information bits further include information about some bits of a system frame number. Therefore, to send information about remaining bits of the system frame number to the terminal, the network device may perform the cyclic shift on the second information sequence to obtain the third information sequence, so as to carry the information about the remaining bits of the system frame number by using a quantity of cyclically shifted bits. When a quantity of remaining bits of the system frame number is n, there are 2n types of quantities of cyclically shifted bits. For example, when the quantity of remaining bits of the system frame number is 2, the remaining 2 bits of the system frame number may be carried by using four types of quantities of cyclically shifted bits.

205. The network device sends the third information sequence to a terminal.

In this embodiment, after performing the cyclic shift on the second information sequence to obtain the third information sequence, the network device sends the third information sequence to the terminal. The network device may broadcast the third information sequence, or send the third information sequence through a PBCH, or send the third information sequence in another manner. This is not limited in this embodiment.

In an embodiment, after performing the cyclic shift on the second information sequence to obtain the third information sequence, the network device may first sequentially perform encoding and rate matching on the third information sequence to obtain a sixth information sequence, and then send the sixth information sequence.

In an embodiment, after interleaving the bits in the first information sequence in an interleaving manner or scrambling the bits in the first information sequence in a scrambling manner, to obtain the second information sequence, the network device may first encode the second information sequence to obtain a sixth information sequence, and then perform a cyclic shift on the sixth information sequence to obtain the third information sequence. After performing the cyclic shift on the sixth information sequence to obtain the third information sequence, the network device may further perform rate matching on the third information sequence and then send the third information sequence.

For example, when an information sequence is $[a_1, a_2, a_3, \ldots, a_N]$, an information sequence obtained after encoding may be $[a_1^{(1)}a_1^{(2)}a_1^{(3)}, a_2^{(1)}a_2^{(2)}a_2^{(3)}, a_3^{(1)}a_3^{(2)}a_3^{(3)}, \ldots, a_N^{(1)}a_N^{(2)}a_N^{(3)}]$. An information sequence obtained after the information sequence is cyclically shifted by k bits may be $[a_{k+1}, a_{k+2}, \ldots, a_N, a_1, a_2, \ldots, a_k]$, and a sequence obtained after the information sequence is cyclically shifted by k bits and then encoded or a sequence obtained after the information sequence is encoded and then cyclically shifted by k bits may be $[a_{k+1}^{(1)}, a_{k+1}^{(2)}a_{k+1}^{(3)}, a_{k+2}a_{k+2}^{(2)}a_{k+2}^{(3)}, \ldots, a_N^{(1)}a_N^{(2)}a_N^{(3)}, a_1^{(1)}a_1^{(2)}a_1^{(3)}, a_2^{(1)}a_2^{(2)}a_2^{(3)}, \ldots, a_k^{(1)}a_k^{(2)}a_k^{(3)}]$.

206. The terminal performs a reverse cyclic shift on the third information sequence to obtain a seventh information sequence.

In this embodiment, after receiving the third information sequence sent by the network device, the terminal performs the reverse cyclic shift on the third information sequence to obtain the seventh information sequence. A quantity of reversely cyclically shifted bits may be greater than or equal to 0 and less than or equal to a length of the third information sequence, and the quantity of reversely cyclically shifted bits is not fixed.

207. The terminal de-interleaves the seventh information sequence based on an interleaving manner or descrambles the seventh information sequence based on a scrambling manner, to obtain an eighth information sequence.

In this embodiment, after performing the reverse cyclic shift on the third information sequence to obtain the seventh information sequence, the terminal may de-interleave the seventh information sequence based on an interleaving manner or descramble the seventh information sequence based on a scrambling manner, to obtain the eighth information sequence. The interleaving manner or the scrambling manner is agreed on by the network device and the terminal in advance, and can ensure that bits at CRC bit locations after the cyclic shift cannot check bits at locations of information bits (that is, the to-be-sent information bits mentioned above) after the cyclic shift.

In this embodiment, the seventh information sequence includes reserved bits. A bit at a first bit location may be exchanged with a bit at a second bit location to obtain a ninth information sequence, and the ninth information sequence is determined as the eighth information sequence. The first bit location is a first location in the second information sequence, and the second bit location is a preset bit location in locations of the reserved bits.

In this embodiment, after the bit at the first bit location is exchanged with the bit at the second bit location to obtain the ninth information sequence, bits at t preset bit locations other than the second bit location in the locations of the reserved bits may be exchanged with bits at t preset bit locations in bit locations, in the ninth information sequence, other than the locations of the reserved bits and the first bit location, to obtain a tenth information sequence, and the tenth information sequence is determined as the eighth information sequence, where t is greater than or equal to 1 and less than a quantity of bit locations of the reserved bits.

In this embodiment, a bit at a first location in the second information sequence may be shifted to a first interval to obtain a ninth information sequence, and the ninth information sequence is determined as the eighth information sequence. The first interval is a preset interval between bit locations in locations of the reserved bits.

In this embodiment, after the bit at the first location in the second information sequence is shifted to the first interval to obtain the ninth information sequence, bits at t preset bit locations may be separately shifted to t preset intervals to obtain a tenth information sequence, and the tenth information sequence is determined as the eighth information sequence.

In this embodiment, a bit at a first bit location in the seventh information sequence may be shifted to the end of the seventh information sequence to obtain ninth information, and the ninth information sequence is determined as the eighth information sequence.

208. When CRC check of the eighth information sequence succeeds, the terminal determines bits in the eighth information sequence that are at information bit locations as information bits; and determines some bits of a system frame number based on a mapping relationship by using a quantity of reversely cyclically shifted bits.

In this embodiment, after de-interleaving the seventh information sequence based on an interleaving manner or descrambling the seventh information sequence based on a scrambling manner, to obtain the eighth information sequence, the terminal check information bits in the eighth information sequence based on CRC bits in the eighth information sequence. When the check succeeds, it indicates that the quantity of reversely cyclically shifted bits is equal to the quantity of bits cyclically shifted by the network device. In this case, the bits in the eighth information sequence that are at the information bit locations may be determined as the information bits (that is, the to-be-sent information bits described on the network device side), and some bits of the system frame number may be determined based on the mapping relationship by using the quantity of reversely cyclically shifted bits, so as to determine the system frame number used to send the third information bit sequence. First CRC bits of the bits in the eighth information sequence that are at the information bit locations may be calculated, and the first CRC bits are compared with second CRC bits at CRC bit locations in the eighth information sequence. When the first CRC bits are the same as the second CRC bits, it indicates that the check succeeds.

In this embodiment, the information bits may include reserved bits, and a bit at a preset bit location of the reserved bits is 1.

In an embodiment, the terminal may first perform rate de-matching on the third information sequence, and then perform a reverse cyclic shift on third information obtained after rate de-matching is performed, to obtain the seventh information sequence. Next, the terminal may first decode the seventh information sequence to obtain an eleventh information sequence, and then de-interleave the eleventh information sequence based on an interleaving manner or descramble the eleventh information sequence based on a scrambling manner, to obtain the eighth information sequence.

In an embodiment, the terminal may sequentially perform rate de-matching and decoding on the third information sequence to obtain an eleventh information sequence, and then perform a reverse cyclic shift on the eleventh information sequence to obtain the seventh information sequence.

In the information transmission method described in FIG. 2, the network device determines the CRC bits of the to-be-sent information bits; concatenates the CRC bits and the to-be-sent information bits to obtain the first information sequence; interleaves the bits in the first information sequence in an interleaving manner or scrambles the bits in the first information sequence in a scrambling manner, to obtain the second information sequence; performs the cyclic shift on the second information sequence to obtain the third information sequence; and sends the third information sequence to the terminal. The terminal performs the reverse cyclic shift on the third information sequence to obtain the seventh information sequence, and de-interleaves the seventh information sequence based on an interleaving manner or descrambles the seventh information sequence based on a scrambling manner, to obtain the eighth information sequence. When the CRC check of the eighth information sequence succeeds, the bits in the eighth information sequence that are at the information bit locations are determined as the information bits, and some bits of the system frame number are determined based on the mapping relationship by using the quantity of reversely cyclically shifted bits. The quantity of cyclically shifted bits carries the information about some bits of the system frame number, so that the terminal can determine, through the reverse cyclic shift, a shift performed on information by the network device before the network device sends the information, to determine the system frame number. Therefore, it can be learned that decoding does not need to be performed a plurality of times. In this way, a quantity of decoding times may be decreased, thereby reducing a delay of obtaining the information by the terminal. In addition, the interleaving manner or the scrambling manner can ensure that the bits at the locations of the CRC bits after the cyclic shift cannot check the bits at the locations of the to-be-sent information bits after the cyclic shift. Therefore, CRC check can succeed only when the quantity of cyclically shifted bits is correctly determined so that the to-be-sent information bits are reversely cyclically shifted to locations before the cyclic shift. In this way, the information that is about some bits of the system frame number and that is carried by the quantity of cyclically shifted bits can be accurately determined, so that the terminal can accurately obtain the information sent by the network device.

Figure 3:
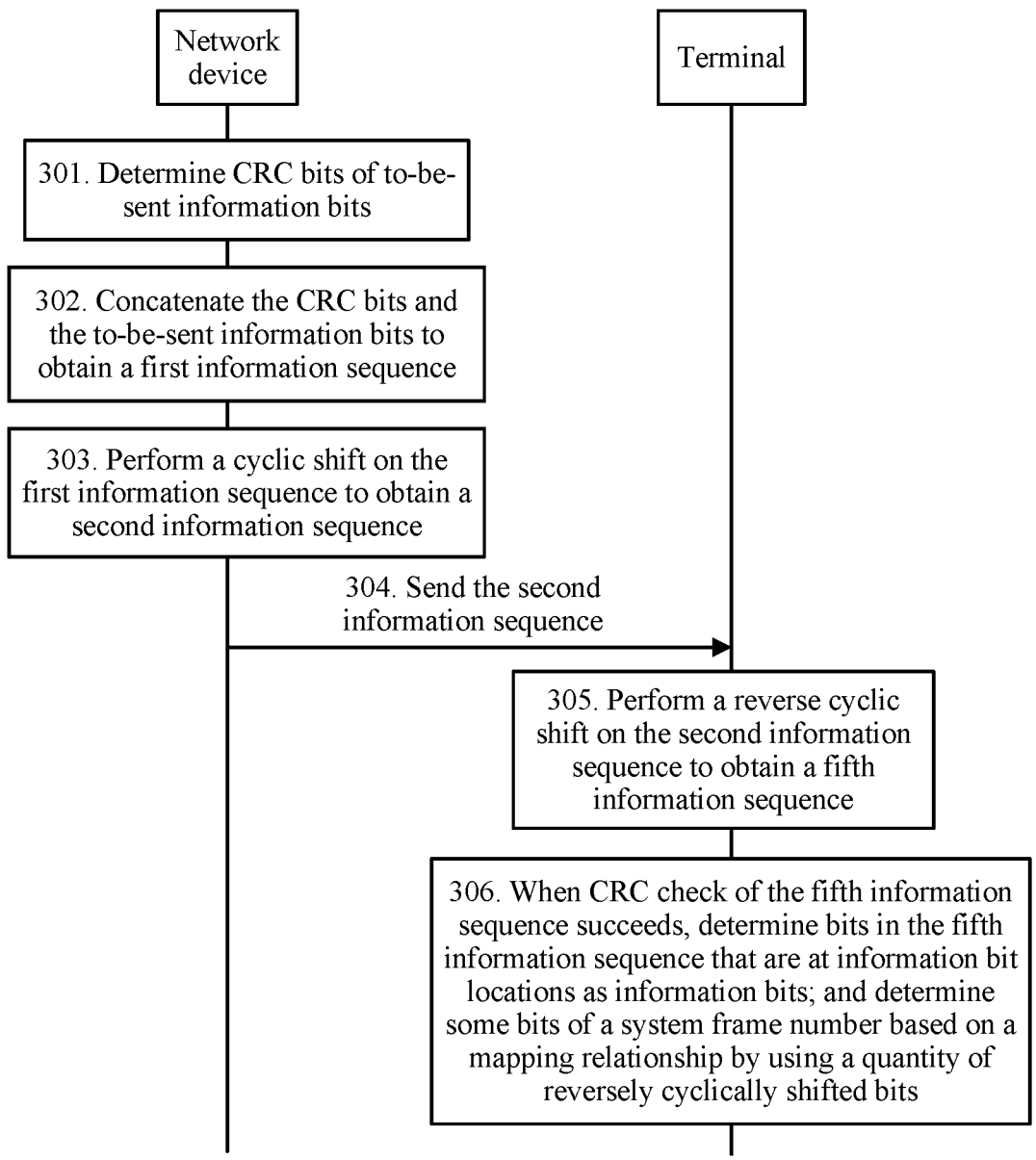
FIG. 3 is a schematic flowchart of another information transmission method according to an embodiment of the present invention.

Based on the network architecture shown in FIG. 1, FIG. 3 is a schematic flowchart of another information transmission method according to an embodiment of the present invention. As shown in FIG. 3, the information transmission method is described from perspectives of the network device 101 and the terminal 102. As shown in FIG. 3, the information transmission method may include the following steps.

301. A network device determines CRC bits of to-be-sent information bits.

In this embodiment, when the network device has to-be-sent information bits, that is, when the network device needs to send information bits to a terminal, the network device determines CRC bits of the to-be-sent information bits. The CRC bits are obtained through calculation by using the to-be-sent information bits. The terminal may determine, by using the CRC bits, whether the received information bits are correct information bits, so that the terminal can accurately determine transmitted information by using the CRC bits. The to-be-sent information bits include reserved bits, at least one of the reserved bits is at the beginning of the to-be-sent information bits, and a bit at a first location of the to-be-sent information bits that is a reserved bit location is 1. In addition, t bit locations of the reserved bits may be bit locations other than the first location of the to-be-sent information bits and bit locations at which the reserved bits are located, and all bits at the t bit locations are 1. The reserved bits may be an all zeros sequence, an all ones sequence, or another sequence; and t is greater than or equal to 1 and less than a quantity of bit locations of the reserved bits.

302. The network device concatenates the CRC bits and the to-be-sent information bits to obtain a first information sequence.

In this embodiment, after determining the CRC bits of the to-be-sent information bits, the network device may concatenate the CRC bits and the to-be-sent information bits to obtain the first information sequence. The network device may concatenate the CRC bits after the to-be-sent information bits, or may concatenate the to-be-sent information bits after the CRC bits, may insert the CRC bits into a location between the to-be-sent information bits, or may use another concatenation manner. This is not limited in this embodiment.

303. The network device performs a cyclic shift on the first information sequence to obtain a second information sequence.

In this embodiment, the to-be-sent information bits further include information about some bits of a system frame number. Therefore, to send information about remaining bits of the system frame number to the terminal, the network device may perform the cyclic shift on the first information sequence to obtain the second information sequence, so as to carry the information about the remaining bits of the system frame number by using a quantity of cyclically shifted bits. When a quantity of remaining bits of the system frame number is n, there are 2n types of quantities of cyclically shifted bits. For example, when the quantity of remaining bits of the system frame number is 2, the remaining 2 bits of the system frame number may be carried by using four types of quantities of cyclically shifted bits.

In an embodiment, encoding and rate matching may be first sequentially performed on the second information sequence to obtain a third information sequence, and then the third information sequence is sent.

In an embodiment, the first information sequence may be first encoded to obtain a fourth information sequence, and then a cyclic shift is performed on the fourth information sequence to obtain the second information sequence.

304. The network device sends the second information sequence.

In this embodiment, after performing the cyclic shift on the first information sequence to obtain the second information sequence, the network device sends the second information sequence to the terminal. The network device may send the second information sequence through broadcast or a PBCH, or may send the second information sequence in another manner. This is not limited in this embodiment.

305. A terminal performs a reverse cyclic shift on the second information sequence to obtain a fifth information sequence.

In this embodiment, after receiving the second information sequence sent by the network device, the terminal performs the reverse cyclic shift on the second information sequence to obtain the fifth information sequence. A quantity of reversely cyclically shifted bits may be greater than or equal to 0 and less than or equal to a length of the second information sequence, and the quantity of reversely cyclically shifted bits is not fixed.

306. When CRC check of the fifth information sequence succeeds, the terminal determines bits in the fifth information sequence that are at information bit locations as information bits; and determines some bits of a system frame number based on a mapping relationship by using a quantity of reversely cyclically shifted bits.

In this embodiment, after performing the reverse cyclic shift on the second information sequence to obtain the fifth information sequence, the terminal checks information bits in the fifth information sequence based on CRC bits in the fifth information sequence. When the check succeeds, it indicates that the quantity of reversely cyclically shifted bits is equal to the quantity of bits cyclically shifted by the network device. In this case, the bits in the fifth information sequence that are at the information bit locations may be determined as the information bits (that is, the to-be-sent information bits described on the network device side), and some bits of the system frame number may be determined based on the mapping relationship by using the quantity of reversely cyclically shifted bits, so as to determine the system frame number used to send the second information bit sequence. First CRC bits of the bits in the fifth information sequence that are at the information bit locations may be calculated, and the first CRC bits are compared with second CRC bits at CRC bit locations in the fifth information sequence. When the first CRC bits are the same as the second CRC bits, it indicates that the check succeeds. The information bits include reserved bits, at least one of the reserved bits is at the beginning of the information bits, and a bit at a first location of the information bits that is a reserved bit location is 1. In addition, t bit locations of the reserved bits may be bit locations other than the first location of the information bits and bit locations at which the reserved bits are located, and all bits at the t bit locations are 1.

In an embodiment, the terminal may first sequentially perform rate de-matching and decoding on the second information sequence to obtain a sixth information sequence, and perform a reverse cyclic shift on the sixth information sequence to obtain the fifth information sequence.

In an embodiment, the terminal may first decode the fifth information sequence to obtain a seventh information sequence, and when CRC check of the seventh information sequence succeeds, determine bits in the seventh information sequence that are at the information bit locations as the information bits.

In the information transmission method described in FIG. 3, the network device determines the cyclic redundancy check CRC bits of the to-be-sent information bits. The network device concatenates the CRC bits and the to-be-sent information bits to obtain the first information sequence, performs the cyclic shift on the first information sequence to obtain the second information sequence, and sends the second information sequence. The terminal performs the reverse cyclic shift on the second information sequence to obtain the fifth information sequence. When the CRC check of the fifth information sequence succeeds, the terminal determines the bits in the fifth information sequence that are at the information bit locations as the information bits, and determines some bits of the system frame number based on the mapping relationship by using the quantity of reversely cyclically shifted bits. The quantity of cyclically shifted bits carries information about some bits of the system frame number, so that the terminal can determine, through the reverse cyclic shift, a shift performed on information by the network device before the network device sends the information, to determine the system frame number. Therefore, it can be learned that decoding does not need to be performed a plurality of times. In this way, a quantity of decoding times may be decreased, thereby reducing a delay of obtaining the information by the terminal. In addition, the to-be-sent information bits include reserved bits, at least one of the reserved bits is at the beginning of the to-be-sent information bits, and a bit at a first location of the to-be-sent information bits that is a reserved bit location is 1. Therefore, it can be ensured that bits at locations of the CRC bits after the cyclic shift cannot check bits at locations of the to-be-sent information bits after the cyclic shift, so that the terminal can accurately obtain the information sent by the network device.

Figure 4:
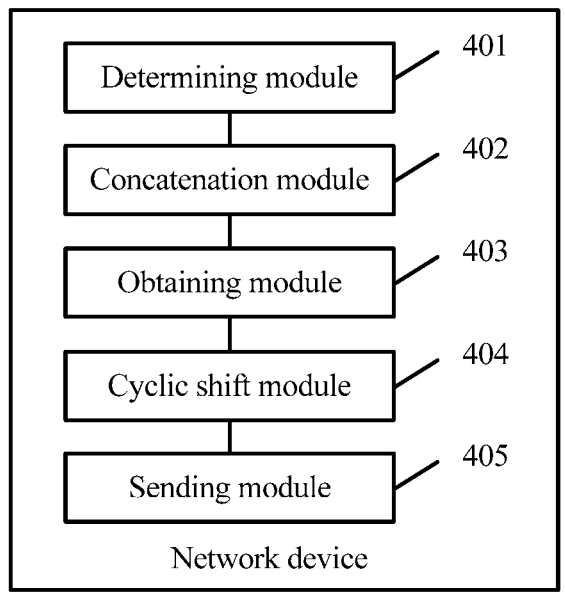
FIG. 4 is a schematic structural diagram of a network device according to an embodiment of the present invention.

Based on the network architecture shown in FIG. 1, FIG. 4 is a schematic structural diagram of a network device according to an embodiment of the present invention. As shown in FIG. 4, the network device may include:

a determining module 401, configured to determine CRC bits of to-be-sent information bits;

a concatenation module 402, configured to concatenate the CRC bits determined by the determining module 401 and the to-be-sent information bits, to obtain a first information sequence;

an obtaining module 403, configured to interleave, in an interleaving manner, bits in the first information sequence obtained through concatenation by the concatenation module 402 or scramble the bits in the first information sequence in a scrambling manner, to obtain a second information sequence, where the interleaving manner or the scrambling manner is used to ensure that bits at locations of the CRC bits after a cyclic shift cannot check bits at locations of the to-be-sent information bits after the cyclic shift;

a cyclic shift module 404, configured to perform the cyclic shift on the second information sequence obtained by the obtaining module 403, to obtain a third information sequence, where a quantity of cyclically shifted bits is used to carry information about some bits of a system frame number; and a sending module 405, configured to send the third information sequence obtained by the cyclic shift module 404.

Figure 5:
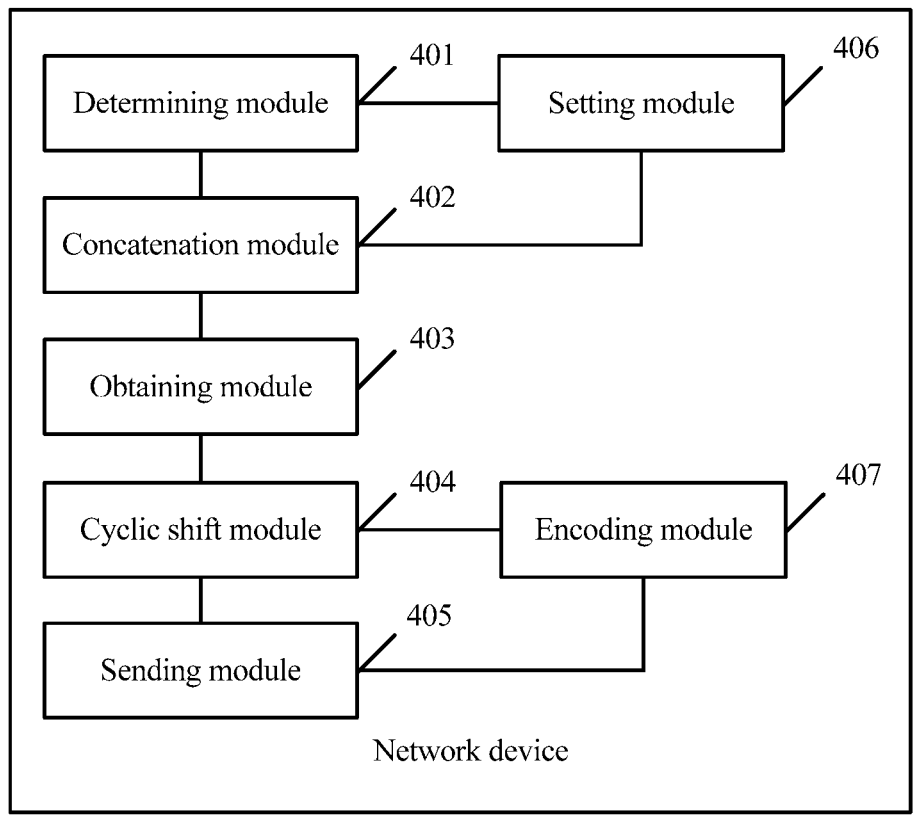
FIG. 5 is a schematic structural diagram of another network device according to an embodiment of the present invention.

Based on the network architecture shown in FIG. 1, FIG. 5 is a schematic structural diagram of another network device according to an embodiment of the present invention. The network device shown in FIG. 5 is obtained by optimizing the network device shown in FIG. 4.

The to-be-sent information bits include reserved bits, and the network device may further include:

a setting module 406, configured to set a bit at a preset bit location of the reserved bits to 1 to obtain target information bits.

The determining module 401 is specifically configured to determine CRC bits of the target information bits obtained by the setting module 406.

The concatenation module 402 is specifically configured to concatenate the CRC bits determined by the determining module 401 and the target information set by the setting module 406, to obtain the first information sequence.

In a possible implementation, the to-be-sent information bits may include reserved bits.

That the obtaining module 403 interleaves bits in the first information sequence in an interleaving manner to obtain a second information sequence includes:

exchanging a bit at a first bit location with a bit at a second bit location to obtain a fourth information sequence, where the first bit location is a first location in the first information sequence, the second bit location is any bit location of the reserved bits, and a bit that is at the first bit location and that is obtained after interleaving is 1; and determining the fourth information sequence as the second information sequence.

In a possible implementation, that the obtaining module 403 interleaves bits in the first information sequence in an interleaving manner to obtain a second information sequence further includes:

exchanging bits at t bit locations other than the second bit location of the reserved bits with bits at t bit locations in the fourth information sequence other than bit locations included in the reserved bits, to obtain a fifth information sequence, where t is greater than or equal to 1 and less than a quantity of bit locations of the reserved bits, and the bits at the t bit locations of the reserved bits each are 1; and that the obtaining module 403 determines the fourth information sequence as the second information sequence includes:

determining the fifth information sequence as the second information sequence.

In a possible implementation, the to-be-sent information bits may include reserved bits.

That the obtaining module 403 interleaves bits in the first information sequence in an interleaving manner to obtain a second information sequence includes:

shifting a bit at a first bit location to the beginning of the first information sequence to obtain a fourth information sequence, where the first bit location is any bit location of the reserved bits, and the bit at the first bit location is 1; and determining the fourth information sequence as the second information sequence.

In a possible implementation, that the obtaining module 403 interleaves bits in the first information sequence in an interleaving manner to obtain a second information sequence further includes:

shifting a bit at a second bit location to a target location to obtain a fifth information sequence, where the target location is any one of t intervals other than a target interval in the fourth information sequence, the target interval is an interval between bit locations other than the first bit location of the reserved bits, the second bit location is any one of t bit locations other than the first bit location of the reserved bits, t is greater than or equal to 1 and less than a quantity of bit locations of the reserved bits, and the bit at the second bit location is 1; and that the obtaining module 403 determines the fourth information sequence as the second information sequence includes:

determining the fifth information sequence as the second information sequence.

In a possible implementation, the to-be-sent information bits may include reserved bits.

That the obtaining module 403 interleaves bits in the first information sequence in an interleaving manner to obtain a second information sequence includes:

shifting a bit at a third bit location to the beginning of the first information sequence to obtain a fourth information sequence, where the third bit location is a last bit location in the first information sequence, and a bit at a first location in the fourth information sequence is 1; and determining the fourth information sequence as the second information sequence.

In a possible implementation, the network device may further include:

an encoding module 407, configured to sequentially perform encoding and rate matching on the third information sequence obtained by the cyclic shift module 404, to obtain a sixth information sequence.

The sending module 405 is specifically configured to send the sixth information sequence obtained by the encoding module 407.

Figure 6:
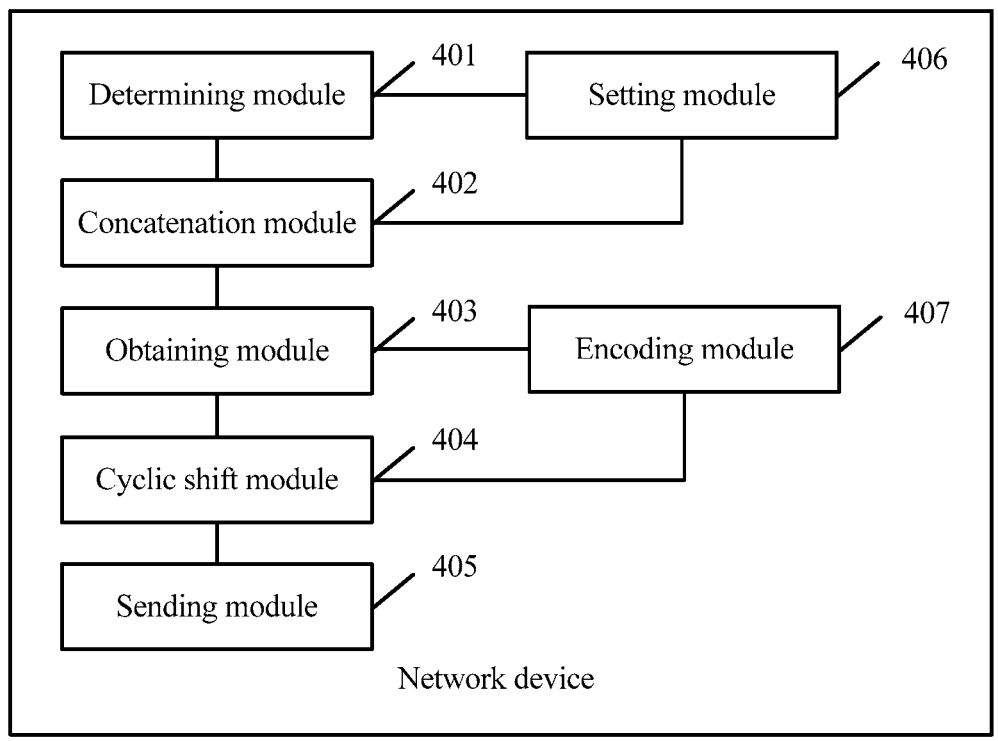
FIG. 6 is a schematic structural diagram of still another network device according to an embodiment of the present invention.

Based on the network architecture shown in FIG. 1, FIG. 6 is a schematic structural diagram of still another network device according to an embodiment of the present invention. The network device shown in FIG. 6 is obtained by optimizing the network device shown in FIG. 4.

The to-be-sent information bits include reserved bits, and the network device may further include:

a setting module 406, configured to set a bit at a preset bit location of the reserved bits to 1 to obtain target information bits.

The determining module 401 is specifically configured to determine CRC bits of the target information bits obtained by the setting module 406.

The concatenation module 402 is specifically configured to concatenate the CRC bits determined by the determining module 401 and the target information set by the setting module 406, to obtain the first information sequence.

In a possible implementation, the to-be-sent information bits may include reserved bits.

That the obtaining module 403 interleaves bits in the first information sequence in an interleaving manner to obtain a second information sequence includes:

exchanging a bit at a first bit location with a bit at a second bit location to obtain a fourth information sequence, where the first bit location is a first location in the first information sequence, the second bit location is any bit location of the reserved bits, and a bit that is at the first bit location and that is obtained after interleaving is 1; and determining the fourth information sequence as the second information sequence.

In a possible implementation, that the obtaining module 403 interleaves bits in the first information sequence in an interleaving manner to obtain a second information sequence further includes:

exchanging bits at t bit locations other than the second bit location of the reserved bits with bits at t bit locations in the fourth information sequence other than bit locations included in the reserved bits, to obtain a fifth information sequence, where t is greater than or equal to 1 and less than a quantity of bit locations of the reserved bits, and the bits at the t bit locations of the reserved bits each are 1; and that the obtaining module 403 determines the fourth information sequence as the second information sequence includes:

determining the fifth information sequence as the second information sequence.

In a possible implementation, the to-be-sent information bits may include reserved bits.

That the obtaining module 403 interleaves bits in the first information sequence in an interleaving manner to obtain a second information sequence includes:

shifting a bit at a first bit location to the beginning of the first information sequence to obtain a fourth information sequence, where the first bit location is any bit location of the reserved bits, and the bit at the first bit location is 1; and determining the fourth information sequence as the second information sequence.

In a possible implementation, that the obtaining module 403 interleaves bits in the first information sequence in an interleaving manner to obtain a second information sequence further includes:

shifting a bit at a second bit location to a target location to obtain a fifth information sequence, where the target location is any one of t intervals other than a target interval in the fourth information sequence, the target interval is an interval between bit locations other than the first bit location of the reserved bits, the second bit location is any one of t bit locations other than the first bit location of the reserved bits, t is greater than or equal to 1 and less than a quantity of bit locations of the reserved bits, and the bit at the second bit location is 1; and that the obtaining module 403 determines the fourth information sequence as the second information sequence includes:

determining the fifth information sequence as the second information sequence.

In a possible implementation, the to-be-sent information bits may include reserved bits.

That the obtaining module 403 interleaves bits in the first information sequence in an interleaving manner to obtain a second information sequence includes:

shifting a bit at a third bit location to the beginning of the first information sequence to obtain a fourth information sequence, where the third bit location is a last bit location in the first information sequence, and a bit at a first location in the fourth information sequence is 1; and determining the fourth information sequence as the second information sequence.

In a possible implementation, the network device may further include:

an encoding module 407, configured to encode the second information sequence obtained by the obtaining module 403, to obtain a sixth information sequence.

The cyclic shift module 404 is specifically configured to perform a cyclic shift on the sixth information sequence obtained by the encoding module 407, to obtain the third information sequence.

Figure 7:
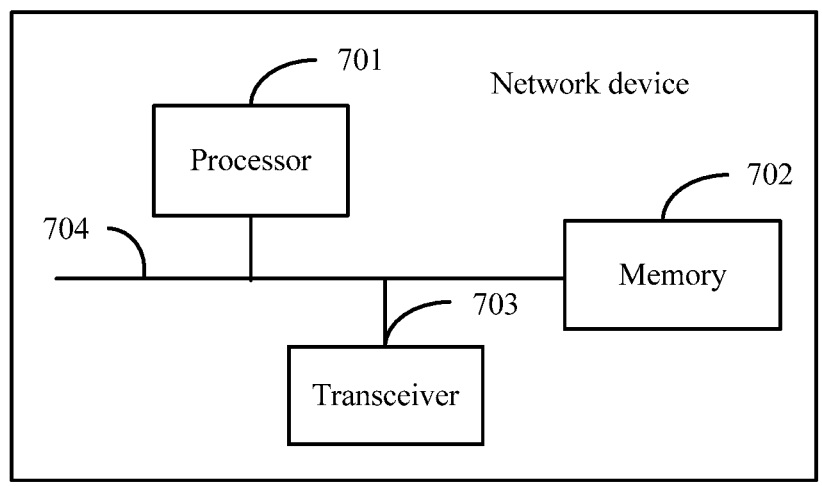
FIG. 7 is a schematic structural diagram of still another network device according to an embodiment of the present invention.

Based on the network architecture shown in FIG. 1, FIG. 7 is a schematic structural diagram of still another network device according to an embodiment of the present invention. As shown in FIG. 7, the network device may include a processor 701, a memory 702, a transceiver 703, and a bus 704.

The bus 704 is configured to connect the components to each other.

The memory 702 stores a set of program code, and the processor 701 is configured to invoke the program code stored in the memory 702 to perform the following operations:

determining CRC bits of to-be-sent information bits;

concatenating the CRC bits and the to-be-sent information bits to obtain a first information sequence;

interleaving bits in the first information sequence in an interleaving manner or scrambling the bits in the first information sequence in a scrambling manner, to obtain a second information sequence, where the interleaving manner or the scrambling manner is used to ensure that bits at locations of the CRC bits after a cyclic shift cannot check bits at locations of the to-be-sent information bits after the cyclic shift; and performing the cyclic shift on the second information sequence to obtain a third information sequence, where a quantity of cyclically shifted bits is used to carry information about some bits of a system frame number.

The transceiver 703 is configured to send the third information sequence.

In a possible implementation, the to-be-sent information bits may include reserved bits, and the processor 701 is further configured to invoke the program code stored in the memory 702 to perform the following operation:

setting a bit at a preset bit location of the reserved bits to 1 to obtain target information bits;

that the processor 701 determines CRC bits of to-be-sent information bits includes:

determining CRC bits of the target information bits; and that the processor 701 concatenates the CRC bits and the to-be-sent information to obtain a first information sequence includes:

concatenating the CRC bits and the target information to obtain the first information sequence.

In a possible implementation, the to-be-sent information bits may include reserved bits.

That the processor 701 interleaves bits in the first information sequence in an interleaving manner to obtain a second information sequence includes:

exchanging a bit at a first bit location with a bit at a second bit location to obtain a fourth information sequence, where the first bit location is a first location in the first information sequence, the second bit location is any bit location of the reserved bits, and a bit that is at the first bit location and that is obtained after interleaving is 1; and determining the fourth information sequence as the second information sequence.

In a possible implementation, after the processor 701 exchanges the bit at the first bit location with the bit at the second bit location to obtain the fourth information sequence, the processor 701 is further configured to invoke the program code stored in the memory 702 to perform the following operation:

exchanging bits at t bit locations other than the second bit location of the reserved bits with bits at t bit locations in the fourth information sequence other than bit locations included in the reserved bits, to obtain a fifth information sequence, where t is greater than or equal to 1 and less than a quantity of bit locations of the reserved bits, and the bits at the t bit locations of the reserved bits are 1.

That the processor 701 determines the fourth information sequence as the second information sequence includes:

determining the fifth information sequence as the second information sequence.

In a possible implementation, the to-be-sent information bits may include reserved bits.

That the processor 701 interleaves bits in the first information sequence in an interleaving manner to obtain a second information sequence includes:

shifting a bit at a first bit location to the beginning of the first information sequence to obtain a fourth information sequence, where the first bit location is any bit location of the reserved bits, and the bit at the first bit location is 1; and determining the fourth information sequence as the second information sequence.

In a possible implementation, after the processor 701 shifts the bit at the first bit location to the beginning of the first information sequence to obtain the fourth information sequence, the processor 701 is further configured to invoke the program code stored in the memory 702 to perform the following operation:

shifting a bit at a second bit location to a target location to obtain a fifth information sequence, where the target location is any one of t intervals other than a target interval in the fourth information sequence, the target interval is an interval between bit locations other than the first bit location of the reserved bits, the second bit location is any one of t bit locations other than the first bit location of the reserved bits, t is greater than or equal to 1 and less than a quantity of bit locations of the reserved bits, and the bit at the second bit location is 1.

That the processor 701 determines the fourth information sequence as the second information sequence includes:

determining the fifth information sequence as the second information sequence.

In a possible implementation, the to-be-sent information bits may include reserved bits.

That the processor 701 interleaves bits in the first information sequence in an interleaving manner to obtain a second information sequence includes:

shifting a bit at a third bit location to the beginning of the first information sequence to obtain a fourth information sequence, where the third bit location is a last bit location in the first information sequence, and a bit at a first location in the fourth information sequence is 1; and determining the fourth information sequence as the second information sequence.

In a possible implementation, the processor 701 is further configured to invoke the program code stored in the memory 702 to perform the following operation:

sequentially performing encoding and rate matching on the third information sequence to obtain a sixth information sequence.

That the transceiver 703 sends the third information sequence includes:

sending the sixth information sequence.

In a possible implementation, the processor 701 is further configured to invoke the program code stored in the memory 702 to perform the following operation:

encoding the second information sequence to obtain a sixth information sequence.

That the processor 701 performs a cyclic shift on the second information sequence to obtain a third information sequence includes:

performing a cyclic shift on the sixth information sequence to obtain the third information sequence.

Steps 201 to 204 may be performed by the processor 701 and the memory 702 in the network device, and step 205 may be performed by the transceiver 703 in the network device.

The determining module 401, the concatenation module 402, the obtaining module 403, the cyclic shift module 404, the setting module 406, and the encoding module 407 may be implemented by the processor 701 and the memory 702 in the network device, and the sending module 405 may be implemented by the transceiver 703 in the network device.

Figure 8:
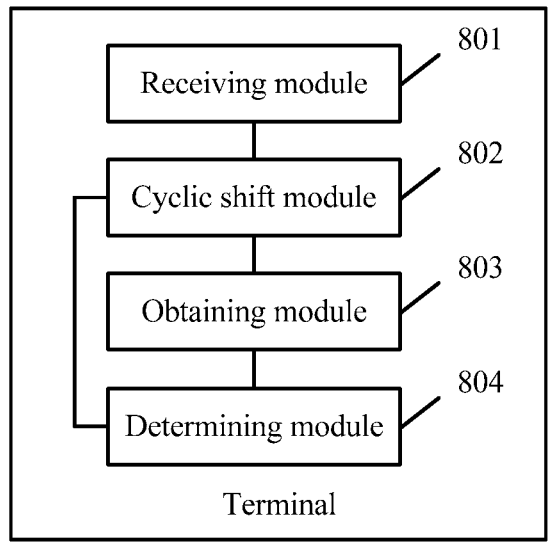
FIG. 8 is a schematic structural diagram of a terminal according to an embodiment of the present invention.

Based on the network architecture shown in FIG. 1, FIG. 8 is a schematic structural diagram of a terminal according to an embodiment of the present invention. As shown in FIG. 8, the terminal 800 may include:

a receiving module 801, configured to receive a first information sequence sent by a network device;

a cyclic shift module 802, configured to perform a reverse cyclic shift on the first information sequence received by the receiving module 801, to obtain a second information sequence;

an obtaining module 803, configured to de-interleave, based on an interleaving manner, the second information sequence obtained by the cyclic shift module 802 or descramble, based on a scrambling manner, the second information sequence obtained by the cyclic shift module 802, to obtain a third information sequence, where the interleaving manner or the scrambling manner is used to ensure that bits at CRC bit locations after a cyclic shift cannot check bits at information bit locations after the cyclic shift; and a determining module 804, configured to: when CRC check of the third information sequence obtained by the obtaining module 803 succeeds, determine bits in the third information sequence that are at the information bit locations as information bits; and determine some bits of a system frame number based on a mapping relationship by using a quantity of bits reversely cyclically shifted by the cyclic shift module 802.

Figure 9:
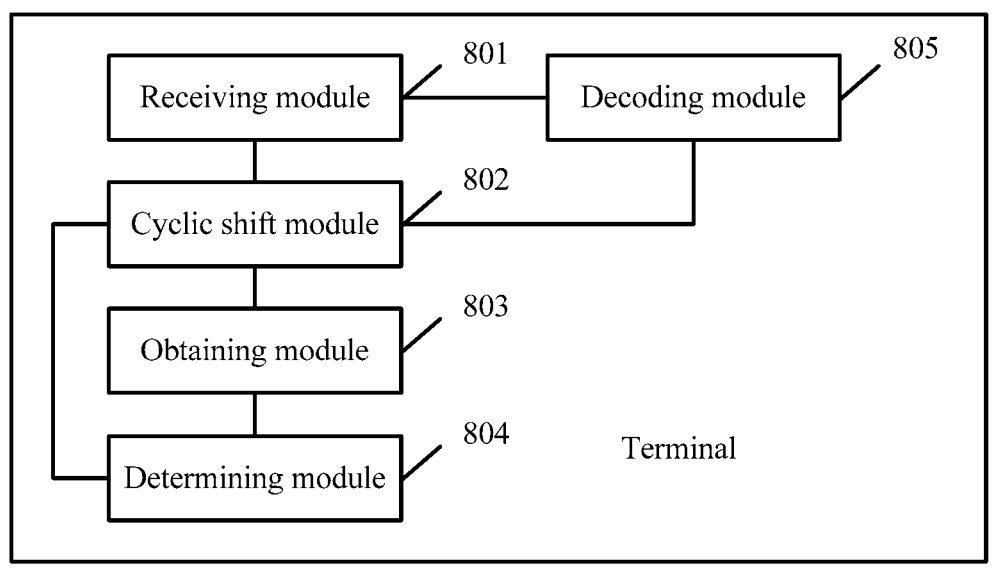
FIG. 9 is a schematic structural diagram of another terminal according to an embodiment of the present invention.

Based on the network architecture shown in FIG. 1, FIG. 9 is a schematic structural diagram of another terminal according to an embodiment of the present invention. The terminal shown in FIG. 9 is obtained by optimizing the terminal shown in FIG. 8.

The information bits may include reserved bits, and a bit at a preset bit location of the reserved bits is 1.

In a possible implementation, the second information sequence may include reserved bits.

That the obtaining module 803 de-interleaves the second information sequence based on an interleaving manner to obtain a third information sequence includes:

exchanging a bit at a first bit location with a bit at a second bit location to obtain a fourth information sequence, where the first bit location is a first location in the second information sequence, and the second bit location is a preset bit location in locations of the reserved bits; and determining the fourth information sequence as the third information sequence.

In a possible implementation, that the obtaining module 803 de-interleaves the second information sequence based on an interleaving manner to obtain a third information sequence further includes:

exchanging bits at t preset bit locations other than the second bit location in the locations of the reserved bits with bits at t preset bit locations in bit locations, in the fourth information sequence, other than the locations of the reserved bits and the first bit location, to obtain a fifth information sequence, where t is greater than or equal to 1 and less than a quantity of bit locations of the reserved bits; and that the obtaining module 803 determines the fourth information sequence as the third information sequence includes:

determining the fifth information sequence as the third information sequence.

In a possible implementation, the second information sequence may include reserved bits.

That the obtaining module 803 de-interleaves the second information sequence based on an interleaving manner to obtain a third information sequence includes:

shifting a bit at a first location in the second information sequence to a first interval to obtain a fourth information sequence, where the first interval is a preset interval between bit locations in locations of the reserved bits; and determining the fourth information sequence as the third information sequence.

In a possible implementation, that the obtaining module 803 de-interleaves the second information sequence based on an interleaving manner to obtain a third information sequence further includes:

separately shifting bits at t preset bit locations to t preset intervals to obtain a fifth information sequence, where t is greater than or equal to 1 and less than a quantity of bit locations of the reserved bits; and that the obtaining module 803 determines the fourth information sequence as the third information sequence includes:

determining the fifth information sequence as the third information sequence.

In a possible implementation, the second information sequence may include reserved bits.

That the obtaining module 803 de-interleaves the second information sequence based on an interleaving manner to obtain a third information sequence includes:

shifting a bit at a first bit location in the second information sequence to the end of the second information sequence to obtain fourth information; and determining the fourth information sequence as the third information sequence.

In a possible implementation, the terminal may further include:

a decoding module 805, configured to decode the first information sequence received by the receiving module 801, to obtain a sixth information sequence.

The cyclic shift module 802 is specifically configured to perform a reverse cyclic shift on the sixth information sequence obtained by the decoding module 805, to obtain the second information sequence.

Figure 10:
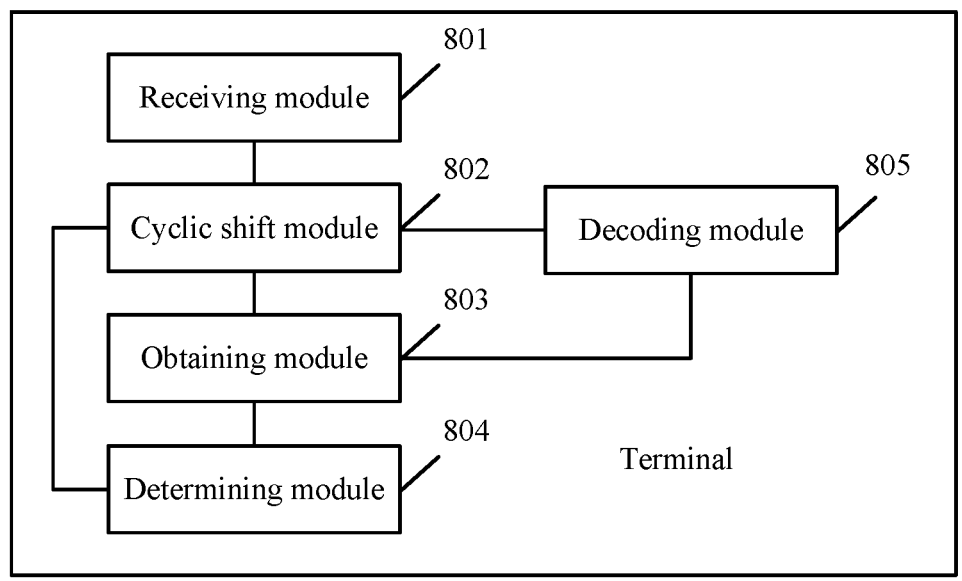
FIG. 10 is a schematic structural diagram of still another terminal according to an embodiment of the present invention.

Based on the network architecture shown in FIG. 1, FIG. 10 is a schematic structural diagram of still another terminal according to an embodiment of the present invention. The terminal shown in FIG. 10 is obtained by optimizing the terminal shown in FIG. 8.

The information bits may include reserved bits, and a bit at a preset bit location of the reserved bits is 1.

In a possible implementation, the second information sequence may include reserved bits.

That the obtaining module 803 de-interleaves the second information sequence based on an interleaving manner to obtain a third information sequence includes:

exchanging a bit at a first bit location with a bit at a second bit location to obtain a fourth information sequence, where the first bit location is a first location in the second information sequence, and the second bit location is a preset bit location in locations of the reserved bits; and determining the fourth information sequence as the third information sequence.

In a possible implementation, that the obtaining module 803 de-interleaves the second information sequence based on an interleaving manner to obtain a third information sequence further includes:

exchanging bits at t preset bit locations other than the second bit location in the locations of the reserved bits with bits at t preset bit locations in bit locations, in the fourth information sequence, other than the locations of the reserved bits and the first bit location, to obtain a fifth information sequence, where t is greater than or equal to 1 and less than a quantity of bit locations of the reserved bits; and that the obtaining module 803 determines the fourth information sequence as the third information sequence includes:

determining the fifth information sequence as the third information sequence.

In a possible implementation, the second information sequence may include reserved bits.

That the obtaining module 803 de-interleaves the second information sequence based on an interleaving manner to obtain a third information sequence includes:

shifting a bit at a first location in the second information sequence to a first interval to obtain a fourth information sequence, where the first interval is a preset interval between bit locations in locations of the reserved bits; and determining the fourth information sequence as the third information sequence.

In a possible implementation, that the obtaining module 803 de-interleaves the second information sequence based on an interleaving manner to obtain a third information sequence further includes:

separately shifting bits at t preset bit locations to t preset intervals to obtain a fifth information sequence, where t is greater than or equal to 1 and less than a quantity of bit locations of the reserved bits; and that the obtaining module 803 determines the fourth information sequence as the third information sequence includes:

determining the fifth information sequence as the third information sequence.

In a possible implementation, the second information sequence may include reserved bits.

That the obtaining module 803 de-interleaves the second information sequence based on an interleaving manner to obtain a third information sequence includes:

shifting a bit at a first bit location in the second information sequence to the end of the second information sequence to obtain fourth information; and determining the fourth information sequence as the third information sequence.

In a possible implementation, the terminal may further include:

a decoding module 805, configured to decode the second information sequence obtained by the cyclic shift module 802, to obtain a sixth information sequence.

The obtaining module 803 is specifically configured to: de-interleave, based on an interleaving manner, the sixth information sequence obtained by the decoding module 805 or descramble, based on a scrambling manner, the sixth information sequence obtained by the decoding module 805, to obtain the third information sequence.

Figure 11:
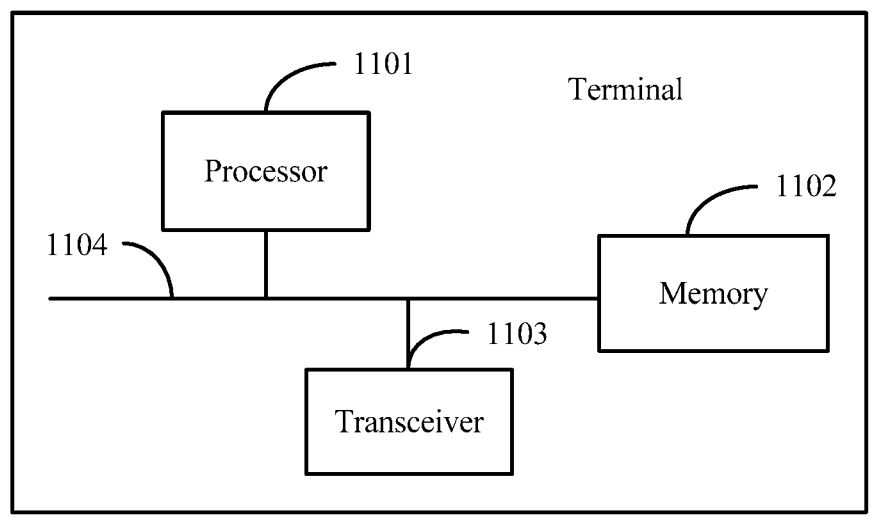
FIG. 11 is a schematic structural diagram of still another terminal according to an embodiment of the present invention.

Based on the network architecture shown in FIG. 1, FIG. 11 is a schematic structural diagram of still another terminal according to an embodiment of the present invention. As shown in FIG. 11, the terminal may include a processor 1101, a memory 1102, a transceiver 1103, and a bus 1104.

The bus 1104 is configured to connect the components to each other.

The transceiver 1103 is configured to: receive a first information sequence sent by a network device, and send the first information sequence to the processor 1101.

The memory 1102 stores a set of program code, and the processor 1101 is configured to invoke the program code stored in the memory 1102 to perform the following operations:

performing a reverse cyclic shift on the first information sequence to obtain a second information sequence;

de-interleaving the second information sequence based on an interleaving manner or descrambling the second information sequence based on a scrambling manner, to obtain a third information sequence, where the interleaving manner or the scrambling manner is used to ensure that bits at CRC bit locations after a cyclic shift cannot check bits at information bit locations after the cyclic shift; and when CRC check of the third information sequence succeeds, determining bits in the third information sequence that are at the information bit locations as information bits; and determining some bits of a system frame number based on a mapping relationship by using a quantity of reversely cyclically shifted bits.

In a possible implementation, the information bits may include reserved bits, and a bit at a preset bit location of the reserved bits is 1.

In a possible implementation, the second information sequence may include reserved bits.

That the processor 1101 de-interleaves the second information sequence based on an interleaving manner to obtain a third information sequence includes:

exchanging a bit at a first bit location with a bit at a second bit location to obtain a fourth information sequence, where the first bit location is a first location in the second information sequence, and the second bit location is a preset bit location in locations of the reserved bits; and determining the fourth information sequence as the third information sequence.

In a possible implementation, after the processor 1101 exchanges the bit at the first bit location with the bit at the second bit location to obtain the fourth information sequence, the processor 1101 is further configured to invoke the program code stored in the memory 1102 to perform the following operation:

exchanging bits at t preset bit locations other than the second bit location in the locations of the reserved bits with bits at t preset bit locations in bit locations, in the fourth information sequence, other than the locations of the reserved bits and the first bit location, to obtain a fifth information sequence, where t is greater than or equal to 1 and less than a quantity of bit locations of the reserved bits.

That the processor 1101 determines the fourth information sequence as the third information sequence includes:

determining the fifth information sequence as the third information sequence.

In a possible implementation, the second information sequence may include reserved bits.

That the processor 1101 de-interleaves the second information sequence based on an interleaving manner to obtain a third information sequence includes:

shifting a bit at a first location in the second information sequence to a first interval to obtain a fourth information sequence, where the first interval is a preset interval between bit locations in locations of the reserved bits; and determining the fourth information sequence as the third information sequence.

In a possible implementation, after shifting the bit at the first bit location to the bit at the second bit location by reversely cyclically shifting 1 bit, to obtain the fourth information sequence, the processor 1101 is further configured to invoke the program code stored in the memory 1102 to perform the following operation: separately shifting bits at t preset bit locations to t preset intervals to obtain a fifth information sequence, where t is greater than or equal to 1 and less than a quantity of bit locations of the reserved bits.

That the processor 1101 determines the fourth information sequence as the third information sequence includes:

determining the fifth information sequence as the third information sequence.

In a possible implementation, the second information sequence may include reserved bits.

That the processor 1101 de-interleaves the second information sequence based on an interleaving manner to obtain a third information sequence includes:

shifting a bit at a first bit location in the second information sequence to the end of the second information sequence to obtain fourth information; and determining the fourth information sequence as the third information sequence.

In a possible implementation, the processor 1101 is further configured to invoke the program code stored in the memory 1102 to perform the following operation:

decoding the first information sequence to obtain a sixth information sequence.

That the processor 1101 performs a reverse cyclic shift on the first information sequence to obtain a second information sequence includes:

performing a reverse cyclic shift on the sixth information sequence to obtain the second information sequence.

In a possible implementation, the processor 1101 is further configured to invoke the program code stored in the memory 1102 to perform the following operation:

decoding the second information sequence to obtain a sixth information sequence.

That the processor 1101 de-interleaves the second information sequence based on an interleaving manner or descrambling the second information sequence based on a scrambling manner, to obtain a third information sequence includes:

de-interleaving the sixth information sequence based on an interleaving manner or descrambling the sixth information sequence based on a scrambling manner, to obtain the third information sequence.

Steps 206 to 208 may be performed by the processor 1101 and the memory 1102 in the terminal, and step 205 in which the terminal receives the third information sequence may be performed by the transceiver 1103 in the terminal.

The cyclic shift module 802, the obtaining module 803, the determining module 804, and the decoding module 805 may be implemented by the processor 1101 and the memory 1102 in the terminal, and the receiving module 801 may be implemented by the transceiver 1103 in the terminal.

Figure 12:
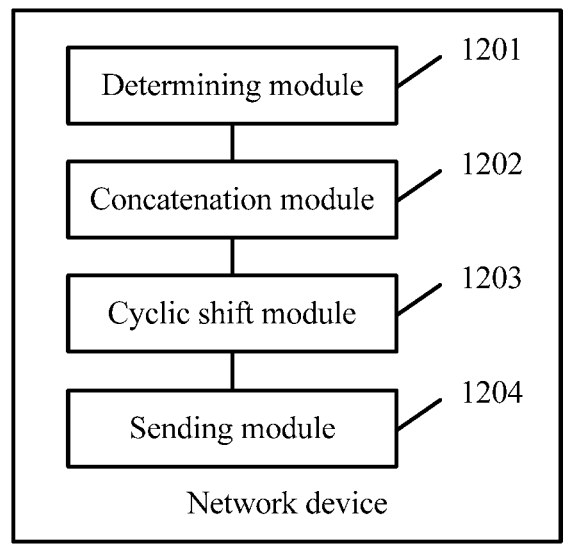
FIG. 12 is a schematic structural diagram of still another network device according to an embodiment of the present invention.

Based on the network architecture shown in FIG. 1, FIG. 12 is a schematic structural diagram of still another network device according to an embodiment of the present invention. As shown in FIG. 12, the network device may include:

a determining module 1201, configured to determine CRC bits of to-be-sent information bits, where the to-be-sent information bits may include reserved bits, at least one of the reserved bits is at the beginning of the to-be-sent information bits, and a bit at a first location of the to-be-sent information bits that is a reserved bit location is 1;

a concatenation module 1202, configured to concatenate the CRC bits determined by the determining module 1201 and the to-be-sent information bits, to obtain a first information sequence;

a cyclic shift module 1203, configured to perform a cyclic shift on the first information sequence obtained by the concatenation module 1202, to obtain a second information sequence, where a quantity of cyclically shifted bits is used to carry some bits of a system frame number; and a sending module 1204, configured to send the second information sequence obtained by the cyclic shift module 1203.

Figure 13:
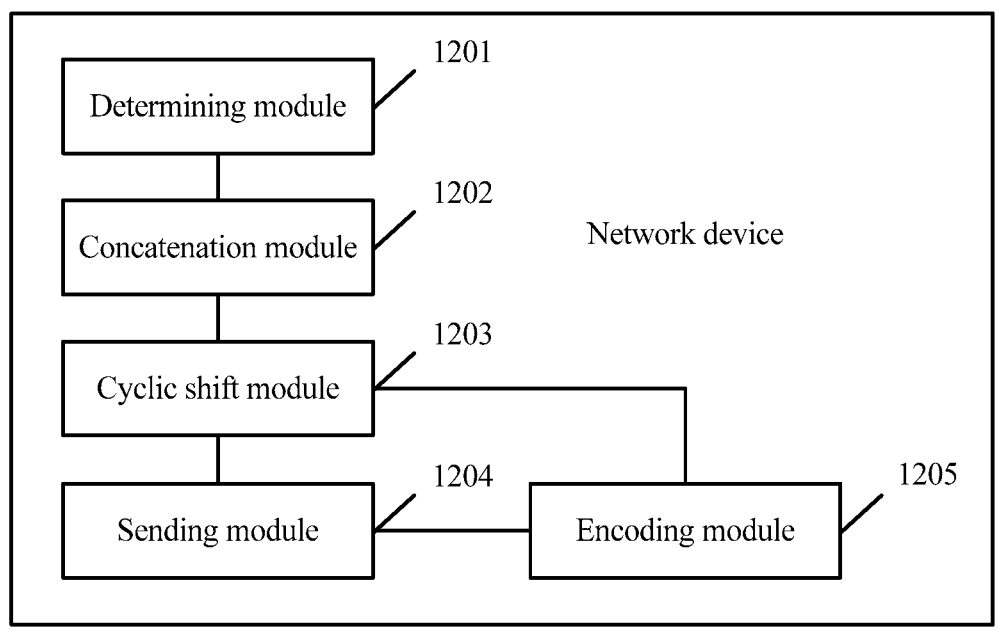
FIG. 13 is a schematic structural diagram of still another network device according to an embodiment of the present invention.

Based on the network architecture shown in FIG. 1, FIG. 13 is a schematic structural diagram of still another network device according to an embodiment of the present invention. The network device shown in FIG. 13 is obtained by optimizing the network device shown in FIG. 12, where t bit locations of the reserved bits are bit locations other than the first location of the to-be-sent information bits and bit locations at which the reserved bits are located, all bits at the t bit locations are 1, and t is greater than or equal to 1 and less than a quantity of bit locations of the reserved bits.

In a possible implementation, the network device may further include:

an encoding module 1205, configured to sequentially perform encoding and rate matching on the second information sequence obtained by the cyclic shift module 1203, to obtain a third information sequence.

The sending module 1204 is specifically configured to send the third information sequence obtained by the encoding module 1205.

Figure 14:
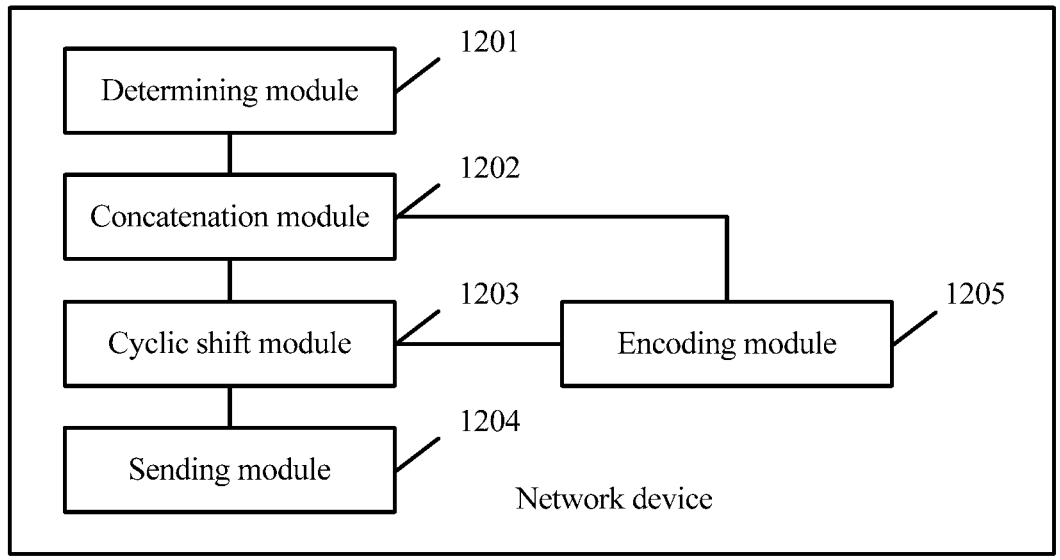
FIG. 14 is a schematic structural diagram of still another network device according to an embodiment of the present invention.

Based on the network architecture shown in FIG. 1, FIG. 14 is a schematic structural diagram of still another network device according to an embodiment of the present invention. The network device shown in FIG. 14 is obtained by optimizing the network device shown in FIG. 12, where t bit locations of the reserved bits are bit locations other than the first location of the to-be-sent information bits and bit locations at which the reserved bits are located, all bits at the t bit locations are 1, and t is greater than or equal to 1 and less than a quantity of bit locations of the reserved bits.

In a possible implementation, the network device may further include:

an encoding module 1205, configured to encode the first information sequence obtained by the concatenation module 1202, to obtain a fourth information sequence.

The cyclic shift module 1203 is specifically configured to perform a cyclic shift on the fourth information sequence obtained by the encoding module 1205, to obtain the second information sequence.

Figure 15:
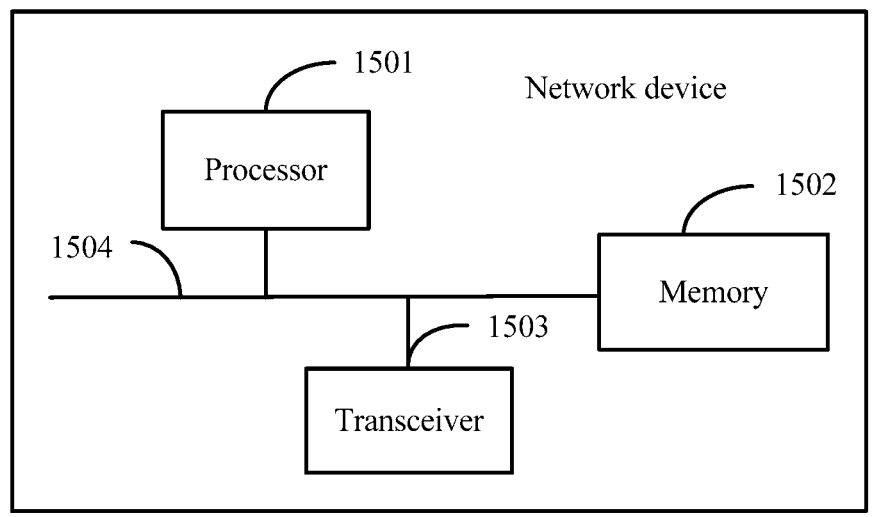
FIG. 15 is a schematic structural diagram of still another network device according to an embodiment of the present invention.

Based on the network architecture shown in FIG. 1, FIG. 15 is a schematic structural diagram of still another network device according to an embodiment of the present invention. As shown in FIG. 15, the network device may include a processor 1501, a memory 1502, a transceiver 1503, and a bus 1504.

The bus 1504 is configured to connect the components to each other.

The memory 1502 stores a set of program code, and the processor 1501 is configured to invoke the program code stored in the memory 1502 to perform the following operations:

determining CRC bits of to-be-sent information bits, where the to-be-sent information bits may include reserved bits, at least one of the reserved bits is at the beginning of the to-be-sent information bits, and a bit at a first location of the to-be-sent information bits that is a reserved bit location is 1;

concatenating the CRC bits and the to-be-sent information bits to obtain a first information sequence; and performing a cyclic shift on the first information sequence to obtain a second information sequence, where a quantity of cyclically shifted bits is used to carry some bits of a system frame number.

The transceiver 1503 is configured to send the second information sequence.

In a possible implementation, t bit locations of the reserved bits may be bit locations other than the first location of the to-be-sent information bits and bit locations at which the reserved bits are located, all bits at the t bit locations are 1, and t is greater than or equal to 1 and less than a quantity of bit locations of the reserved bits.

In a possible implementation, the processor 1501 is further configured to invoke the program code stored in the memory 1502 to perform the following operation:

sequentially performing encoding and rate matching on the second information sequence to obtain a third information sequence.

That the transceiver 1503 sends the second information sequence includes:

sending the third information sequence.

In a possible implementation, the processor 1501 is further configured to invoke the program code stored in the memory 1502 to perform the following operation:

encoding the first information sequence to obtain a fourth information sequence.

That the processor 1501 performs a cyclic shift on the first information sequence to obtain a second information sequence includes:

performing a cyclic shift on the fourth information sequence to obtain the second information sequence.

Steps 301 to 303 may be performed by the processor 1501 and the memory 1502 in the network device, and step 304 may be performed by the transceiver 1503 in the network device.

The determining module 1201, the concatenation module 1202, the cyclic shift module 1203, and the encoding module 1205 may be implemented by the processor 1501 and the memory 1502 in the network device, and the sending module 1204 may be implemented by the transceiver 1503 in the network device.

Figure 16:
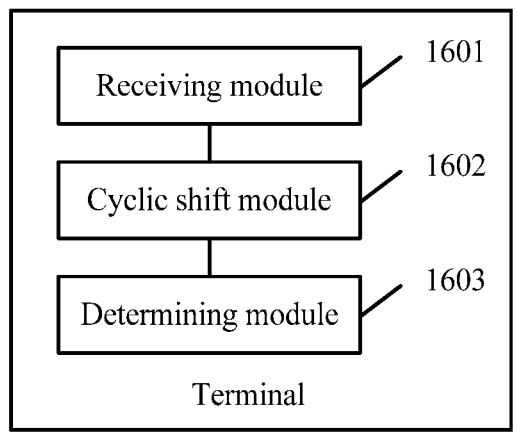
FIG. 16 is a schematic structural diagram of still another terminal according to an embodiment of the present invention.

Based on the network architecture shown in FIG. 1, FIG. 16 is a schematic structural diagram of still another terminal according to an embodiment of the present invention. As shown in FIG. 16, the terminal may include:

a receiving module 1601, configured to receive a first information sequence sent by a network device;

a cyclic shift module 1602, configured to perform a reverse cyclic shift on the first information sequence received by the receiving module 1601, to obtain a second information sequence; and a determining module 1603, configured to: when CRC check of the second information sequence obtained by the cyclic shift module 1602 succeeds, determine bits in the second information sequence that are at information bit locations as information bits; and determine some bits of a system frame number based on a mapping relationship by using a quantity of bits reversely cyclically shifted by the cyclic shift module 1602, where the information bits may include reserved bits, at least one of the reserved bits is at the beginning of the information bits, and a bit at a first location of the information bits that is a reserved bit location is 1.

Figure 17:
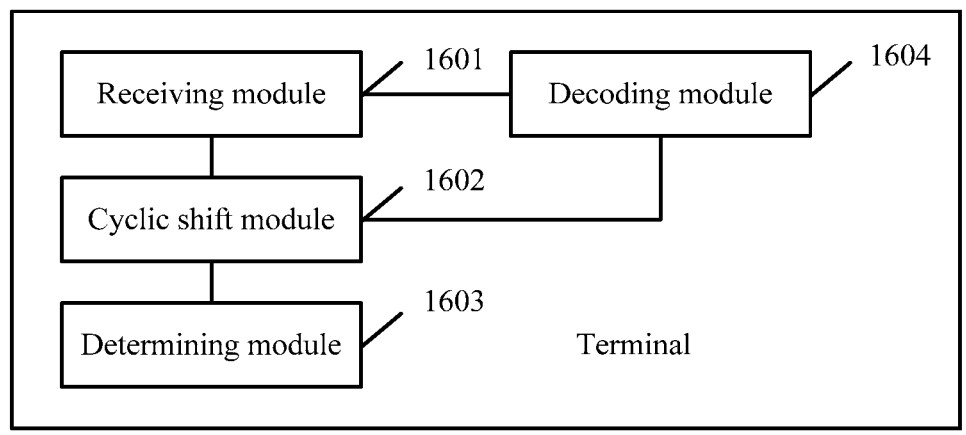
FIG. 17 is a schematic structural diagram of still another terminal according to an embodiment of the present invention.

Based on the network architecture shown in FIG. 1, FIG. 17 is a schematic structural diagram of still another terminal according to an embodiment of the present invention. The terminal shown in FIG. 17 is obtained by optimizing the terminal shown in FIG. 16, where t bit locations of the reserved bits may be bit locations other than the first location of the information bits and bit locations at which the reserved bits are located, all bits at the t bit locations are 1, and t is greater than or equal to 1 and less than a quantity of bit locations of the reserved bits.

In a possible implementation, the terminal may further include:

a decoding module 1604, configured to perform rate de-matching and decoding on the first information sequence received by the receiving module 1601, to obtain a third information sequence.

The cyclic shift module 1602 is configured to perform a reverse cyclic shift on the third information sequence obtained by the decoding module 1604, to obtain the second information sequence.

Figure 18:
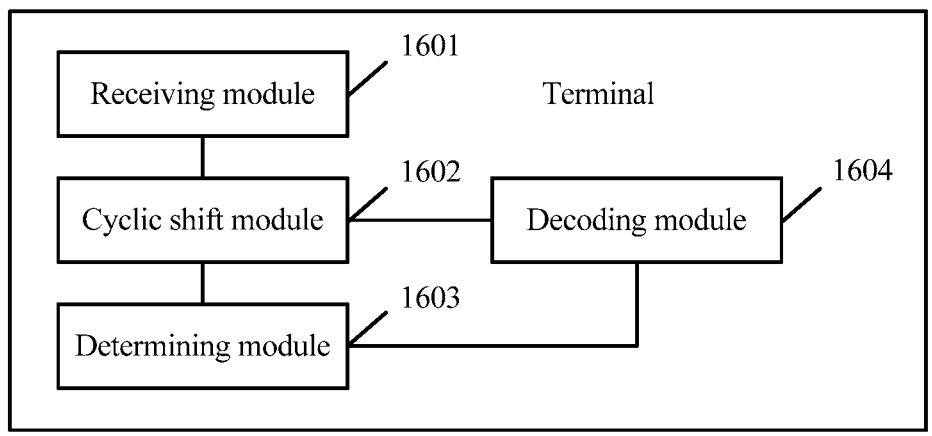
FIG. 18 is a schematic structural diagram of still another terminal according to an embodiment of the present invention.

Based on the network architecture shown in FIG. 1, FIG. 18 is a schematic structural diagram of still another terminal according to an embodiment of the present invention. The terminal shown in FIG. 18 is obtained by optimizing the terminal shown in FIG. 16, where t bit locations of the reserved bits may be bit locations other than the first location of the information bits and bit locations at which the reserved bits are located, all bits at the t bit locations are 1, and t is greater than or equal to 1 and less than a quantity of bit locations of the reserved bits.

In a possible implementation, the terminal may further include:

a decoding module 1604, configured to decode the second information sequence obtained by the cyclic shift module 1602, to obtain a third information sequence.

The determining module 1603 is specifically configured to: when CRC check of the third information sequence obtained by the decoding module 1604 succeeds, determine bits in the third information sequence that are at the information bit locations as the information bits.

Figure 19:
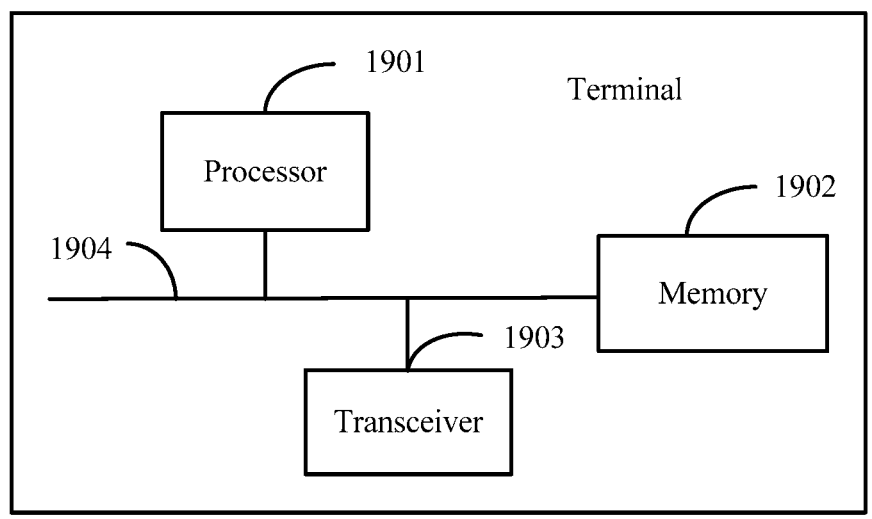
FIG. 19 is a schematic structural diagram of another terminal disclosed in an embodiment of the present invention.

Based on the network architecture shown in FIG. 1, FIG. 19 is a schematic structural diagram of still another terminal according to an embodiment of the present invention. As shown in FIG. 19, the terminal may include a processor 1901, a memory 1902, a transceiver 1903, and a bus 1904.

The bus 1904 is configured to connect the components to each other.

The transceiver 1903 is configured to: receive a first information sequence sent by a network device, and send the first information sequence to the processor 1901.

The memory 1902 stores a set of program code, and the processor 1901 is configured to invoke the program code stored in the memory 1902 to perform the following operations:

performing a reverse cyclic shift on the first information sequence to obtain a second information sequence; and when CRC check of the second information sequence succeeds, determining bits in the second information sequence that are at information bit locations as information bits; and determining some bits of a system frame number based on a mapping relationship by using a quantity of reversely cyclically shifted bits, where the information bits include reserved bits, at least one of the reserved bits is at the beginning of the information bits, and a bit at a first location of the information bits that is a reserved bit location is 1.

In a possible implementation, t bit locations of the reserved bits may be bit locations other than the first location of the information bits and bit locations at which the reserved bits are located, all bits at the t bit locations are 1, and t is greater than or equal to 1 and less than a quantity of bit locations of the reserved bits.

In a possible implementation, the processor 1901 is further configured to invoke the program code stored in the memory 1902 to perform the following operation:

performing rate de-matching and decoding on the first information sequence to obtain a third information sequence.

That the processor 1901 performs a reverse cyclic shift on the first information sequence to obtain a second information sequence includes:

performing a reverse cyclic shift on the third information sequence to obtain the second information sequence.

In a possible implementation, the processor 1901 is further configured to invoke the program code stored in the memory 1902 to perform the following operation:

decoding the second information sequence to obtain a third information sequence.

That when CRC check of the second information sequence succeeds, the processor 1901 determines bits in the second information sequence that are at information bit locations as information bits includes:

when CRC check of the third information sequence succeeds, determining bits in the third information sequence that are at the information bit locations as the information bits.

Steps 305 and 306 may be performed by the processor 1901 and the memory 1902 in the terminal, and step 304 in which the terminal receives the third information sequence may be performed by the transceiver 1903 in the terminal.

The cyclic shift module 1602, the determining module 1603, and the decoding module 1604 may be implemented by the processor 1901 and the memory 1902 in the terminal, and the receiving module 1601 may be implemented by the transceiver 1903 in the terminal.

An embodiment of the present invention further discloses a readable storage medium. The readable storage medium stores program code that is used by a network device and/or a terminal to perform the information transmission methods shown in FIG. 2 and FIG. 3.

Persons of ordinary skill in the art may understand that all or some of the steps of the methods in the embodiments may be implemented by a program instructing related hardware. The program may be stored in readable storage medium. The storage medium may include a flash memory, a read-only memory (read-only memory, ROM), a random access memory (random access memory, RAM), a magnetic disk, an optical disk, and or the like.

What is claimed is:

1. An information transmission method, wherein the method is applied to a network device and comprises:
   determining cyclic redundancy check (CRC) bits of to-be-sent information bits;
   concatenating the CRC bits and the to-be-sent information bits to obtain a first information sequence;
   interleaving bits in the first information sequence in an interleaving manner or scrambling the bits in the first information sequence in a scrambling manner, to obtain a second information sequence, wherein bits at locations of the CRC bits after a cyclic shift cannot check bits at locations of the to-be-sent information bits after the cyclic shift;
   performing the cyclic shift on the second information sequence to obtain a third information sequence, wherein a quantity of cyclically shifted bits is used to carry information about some bits of a system frame number; and
   sending the third information sequence.

2. The method according to claim 1, wherein the to-be-sent information bits comprise reserved bits, and wherein the method further comprises:
   setting a value of a bit at a preset bit location of the reserved bits to 1 to obtain target information bits;
   wherein the determining CRC bits of the to-be-sent information bits comprises:
      determining CRC bits of the target information bits; and
   wherein the concatenating the CRC bits and the to-be-sent information to obtain a first information sequence comprises:
      concatenating the CRC bits and the target information bits to obtain the first information sequence.

3. The method according to claim 1, wherein the to-be-sent information bits comprise reserved bits; and
   wherein the interleaving bits in the first information sequence in an interleaving manner to obtain a second information sequence comprises:
      exchanging a bit at a first bit location with a bit at a second bit location to obtain a fourth information sequence, wherein the first bit location is a first location in the first information sequence, wherein the second bit location is any bit location of the reserved bits, and wherein a value of a bit that is at the first bit location and that is obtained after interleaving is 1; and
      determining the fourth information sequence as the second information sequence.

4. The method according to claim 3, wherein after the exchanging a bit at a first bit location with a bit at a second bit location to obtain a fourth information sequence, the method further comprises:
   exchanging bits at t bit locations other than the second bit location of the reserved bits with bits at t bit locations in the fourth information sequence other than bit locations comprised in the reserved bits, to obtain a fifth information sequence, wherein t is an integer greater than or equal to 1 and less than a quantity of bit locations of the reserved bits, and wherein each bit of the bits at the t bit locations of the reserved bits has a value of 1; and
   wherein the determining the fourth information sequence as the second information sequence comprises:
      determining the fifth information sequence as the second information sequence.

5. The method according to claim 1, wherein the to-be-sent information bits comprise reserved bits; and
   wherein the interleaving bits in the first information sequence in an interleaving manner to obtain a second information sequence comprises:
      shifting a bit at a first bit location to the beginning of the first information sequence to obtain a fourth information sequence, wherein the first bit location is any bit location of the reserved bits, and a value of the bit at the first bit location is 1; and
      determining the fourth information sequence as the second information sequence.

6. The method according to claim 5, wherein after the shifting a bit at a first bit location to the beginning of the first information sequence to obtain a fourth information sequence, the method further comprises:
   shifting a bit at a second bit location to a target location to obtain a fifth information sequence, wherein the target location is any one of t intervals other than a target interval in the fourth information sequence, wherein the target interval is an interval between bit locations other than the first bit location of the reserved bits, the second bit location is any one of t bit locations other than the first bit location of the reserved bits, t is an integer greater than or equal to 1 and less than a quantity of bit locations of the reserved bits, and a value of the bit at the second bit location is 1; and
   the determining the fourth information sequence as the second information sequence comprises:
      determining the fifth information sequence as the second information sequence.

7. The method according to claim 1, wherein the method further comprises:
   sequentially performing encoding and rate matching on the third information sequence to obtain a sixth information sequence; and
   wherein the sending the third information sequence comprises:
      sending the sixth information sequence.

8. An information transmission method, wherein the method is applied to a terminal and comprises:
   receiving a first information sequence sent by a network device;
   performing a reverse cyclic shift on the first information sequence to obtain a second information sequence;
   de-interleaving the second information sequence based on an interleaving manner or descrambling the second information sequence based on a scrambling manner, to obtain a third information sequence, wherein bits at cyclic redundancy check (CRC) bit locations after a cyclic shift cannot check bits at information bit locations after the cyclic shift; and
   when CRC check of the third information sequence succeeds:
      determining bits in the third information sequence that are at the information bit locations as information bits; and
      determining some bits of a system frame number based on a mapping relationship by using a quantity of reversely cyclically shifted bits.

9. The method according to claim 8, wherein the information bits comprise reserved bits, and wherein a value of a bit at a preset bit location of the reserved bits is 1.

10. The method according to claim 8, wherein the second information sequence comprises reserved bits; and wherein the de-interleaving the second information sequence based on an interleaving manner to obtain a third information sequence comprises:

exchanging a bit at a first bit location with a bit at a second bit location to obtain a fourth information sequence, wherein the first bit location is a first location in the second information sequence, and wherein the second bit location is a preset bit location in locations of the reserved bits; and determining the fourth information sequence as the third information sequence.

11. The method according to claim 10, wherein after the exchanging a bit at a first bit location with a bit at a second bit location to obtain a fourth information sequence, the method further comprises:

exchanging bits at t preset bit locations other than the second bit location in the locations of the reserved bits with bits at t preset bit locations in bit locations, in the fourth information sequence, other than the locations of the reserved bits and the first bit location, to obtain a fifth information sequence, wherein t is an integer greater than or equal to 1 and less than a quantity of bit locations of the reserved bits; and wherein the determining the fourth information sequence as the third information sequence comprises:

determining the fifth information sequence as the third information sequence.

12. The method according to claim 8, wherein the second information sequence comprises reserved bits; and wherein the de-interleaving the second information sequence based on an interleaving manner to obtain a third information sequence comprises:

shifting a bit at a first location in the second information sequence to a first interval to obtain a fourth information sequence, wherein the first interval is a preset interval between bit locations in locations of the reserved bits; and determining the fourth information sequence as the third information sequence.

13. The method according to claim 12, wherein after the shifting a bit at a first location in the second information sequence to a first interval to obtain a fourth information sequence, the method further comprises:

separately shifting bits at t preset bit locations to t preset intervals to obtain a fifth information sequence, wherein t is an integer greater than or equal to 1 and less than a quantity of bit locations of the reserved bits; and wherein the determining the fourth information sequence as the third information sequence comprises:

determining the fifth information sequence as the third information sequence.

14. The method according claim 8, wherein the method further comprises:

decoding the first information sequence to obtain a sixth information sequence; and wherein the performing a reverse cyclic shift on the first information sequence to obtain a second information sequence comprises:

performing a reverse cyclic shift on the sixth information sequence to obtain the second information sequence.

15. An information transmission method, wherein the method is applied to a terminal and comprises:

receiving a first information sequence sent by a network device;

performing a reverse cyclic shift on the first information sequence to obtain a second information sequence; and when cyclic redundancy check (CRC) check of the second information sequence succeeds:

determining bits in the second information sequence that are at information bit locations as information bits; and determining some bits of a system frame number based on a mapping relationship by using a quantity of reversely cyclically shifted bits, wherein the information bits comprise reserved bits, at least one of the reserved bits is at the beginning of the information bits, and wherein a value of a bit at a first location of the information bits that is a reserved bit location is 1.

16. The method according to claim 15, wherein t bit locations of the reserved bits are bit locations other than the first location of the information bits and bit locations at which the reserved bits are located, all bits at the t bit locations have a value of 1, and wherein t is an integer greater than or equal to 1 and less than a quantity of bit locations of the reserved bits.

17. The method according to claim 15, wherein the method further comprises:

decoding the first information sequence to obtain a third information sequence; and wherein the performing a reverse cyclic shift on the first information sequence to obtain a second information sequence comprises:

performing a reverse cyclic shift on the third information sequence to obtain the second information sequence.

* * * * *